(12) United States Patent
Hu et al.

(10) Patent No.: US 11,410,934 B2
(45) Date of Patent: Aug. 9, 2022

(54) SUBSTRATE AND SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Ian Hu, Kaohsiung (TW); Shin-Luh Tarng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/850,999

(22) Filed: Apr. 16, 2020

(65) Prior Publication Data

US 2021/0327815 A1 Oct. 21, 2021

(51) Int. Cl.
*H01L 23/48* (2006.01)
*H01L 23/538* (2006.01)
*H01L 21/48* (2006.01)
*H01L 21/50* (2006.01)

(52) U.S. Cl.
CPC ........ *H01L 23/5386* (2013.01); *H01L 21/486* (2013.01); *H01L 21/50* (2013.01); *H01L 23/5384* (2013.01); *H01L 23/5389* (2013.01)

(58) Field of Classification Search
CPC ............. H01L 23/5384; H01L 23/5386; H01L 23/5389; H01L 21/486
USPC ........................................ 257/774, 724, 786
See application file for complete search history.

(56) References Cited

U.S. PATENT DOCUMENTS

| | | | | |
|---|---|---|---|---|
| 5,111,278 A | * | 5/1992 | Eichelberger | H01L 23/473 257/698 |
| 5,565,706 A | * | 10/1996 | Miura | H01L 24/82 257/691 |
| 6,952,049 B1 | * | 10/2005 | Ogawa | H01L 23/13 257/700 |
| 10,306,777 B2 | | 5/2019 | Lin et al. | |
| 2011/0063806 A1 | * | 3/2011 | Kariya | H01L 23/49822 361/748 |
| 2012/0025388 A1 | * | 2/2012 | Law | H01L 25/0657 257/773 |
| 2014/0360759 A1 | * | 12/2014 | Kunieda | H01L 23/5381 174/251 |
| 2015/0084206 A1 | * | 3/2015 | Lin | H01L 23/5389 257/774 |

(Continued)

*Primary Examiner* — Nitin Parekh
(74) *Attorney, Agent, or Firm* — Foley & Lardner LLP

(57) ABSTRACT

A substrate, a semiconductor package device and a method of manufacturing a semiconductor device package are provided. The substrate includes a low density wiring structure, a first middle density wiring structure and high density wiring structure. The first middle density wiring structure is electrically connected to the low density wiring structure. The high density wiring structure is electrically connected to the low density wiring structure. The high density wiring structure and the first middle density wiring structure are disposed side by side. A line space of a circuit layer of the low density wiring structure is greater than a line space of a circuit layer of the first middle density wiring structure. The line space of the circuit layer of the first middle density wiring structure is greater than a line space of a circuit layer of the high density wiring structure.

20 Claims, 33 Drawing Sheets

(56) References Cited

U.S. PATENT DOCUMENTS

| | | | |
|---|---|---|---|
| 2016/0118333 A1* | 4/2016 | Lin | H01L 25/16 |
| | | | 257/773 |
| 2017/0256482 A1* | 9/2017 | Furuichi | H01L 23/49822 |
| 2021/0249381 A1* | 8/2021 | Knickerbocker | H01L 21/563 |

* cited by examiner

US 11,410,934 B2

SUBSTRATE AND SEMICONDUCTOR DEVICE PACKAGE AND METHOD FOR MANUFACTURING THE SAME

BACKGROUND

1. Field of the Disclosure

The present disclosure relates to a substrate, a semiconductor device package and a method for manufacturing the same, and to a substrate including wiring structures, and a method for manufacturing the same.

2. Description of the Related Art

As semiconductor process technologies of wafers keep progressing, semiconductor devices produced therefrom can carry more signals and operate at a higher bandwidth. Concurrently, several new packaging technologies are being implemented on these advanced semiconductor devices. For example, one of the advanced semiconductor devices can be electrically connected to a packaging substrate through a silicon interposer structure. Furthermore, an advanced semiconductor device can be electrically connected to another advanced semiconductor device through an embedded bridge die. However, the massive cost of such packaging technologies is a major problem that hinders the development thereof.

SUMMARY

In some embodiments, a substrate includes a low density wiring structure, a first middle density wiring structure and high density wiring structure. The first middle density wiring structure is electrically connected to the low density wiring structure. The high density wiring structure is electrically connected to the low density wiring structure. The high density wiring structure and the first middle density wiring structure are disposed side by side. A line space of a circuit layer of the low density wiring structure is greater than a line space of a circuit layer of the first middle density wiring structure. The line space of the circuit layer of the first middle density wiring structure is greater than a line space of a circuit layer of the high density wiring structure.

In some embodiments, a semiconductor package device includes a substrate and a first die. The substrate includes a low density wiring structure, a first middle density wiring structure and high density wiring structure. The first middle density wiring structure is electrically connected to the low density wiring structure. The high density wiring structure is electrically connected to the low density wiring structure. The high density wiring structure and the first middle density wiring structure are disposed side by side. A line space of a circuit layer of the low density wiring structure is greater than a line space of a circuit layer of the first middle density wiring structure. The line space of the circuit layer of the first middle density wiring structure is greater than a line space of a circuit layer of the high density wiring structure. The first die is disposed on the substrate. The first die is electrically connected to the high density wiring structure.

In some embodiments, a method of manufacturing a semiconductor device package includes: providing a carrier; attaching a first middle density wiring structure to the carrier; attaching a high density wiring structure to the carrier, wherein the high density wiring structure and the first middle density wiring structure are arranged side by side, forming a low density wiring structure to the first middle density wiring structure and the high density wiring structure; removing the carrier to form a substrate including the low density wiring structure, the first middle density wiring structure and the high density wiring structure; and bonding a first die on the substrate. A line space of a circuit layer of the low density wiring structure is greater than a line space of a circuit layer of the first middle density wiring structure. The line space of the circuit layer of the first middle density wiring structure is greater than a line space of a circuit layer of the high density wiring structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
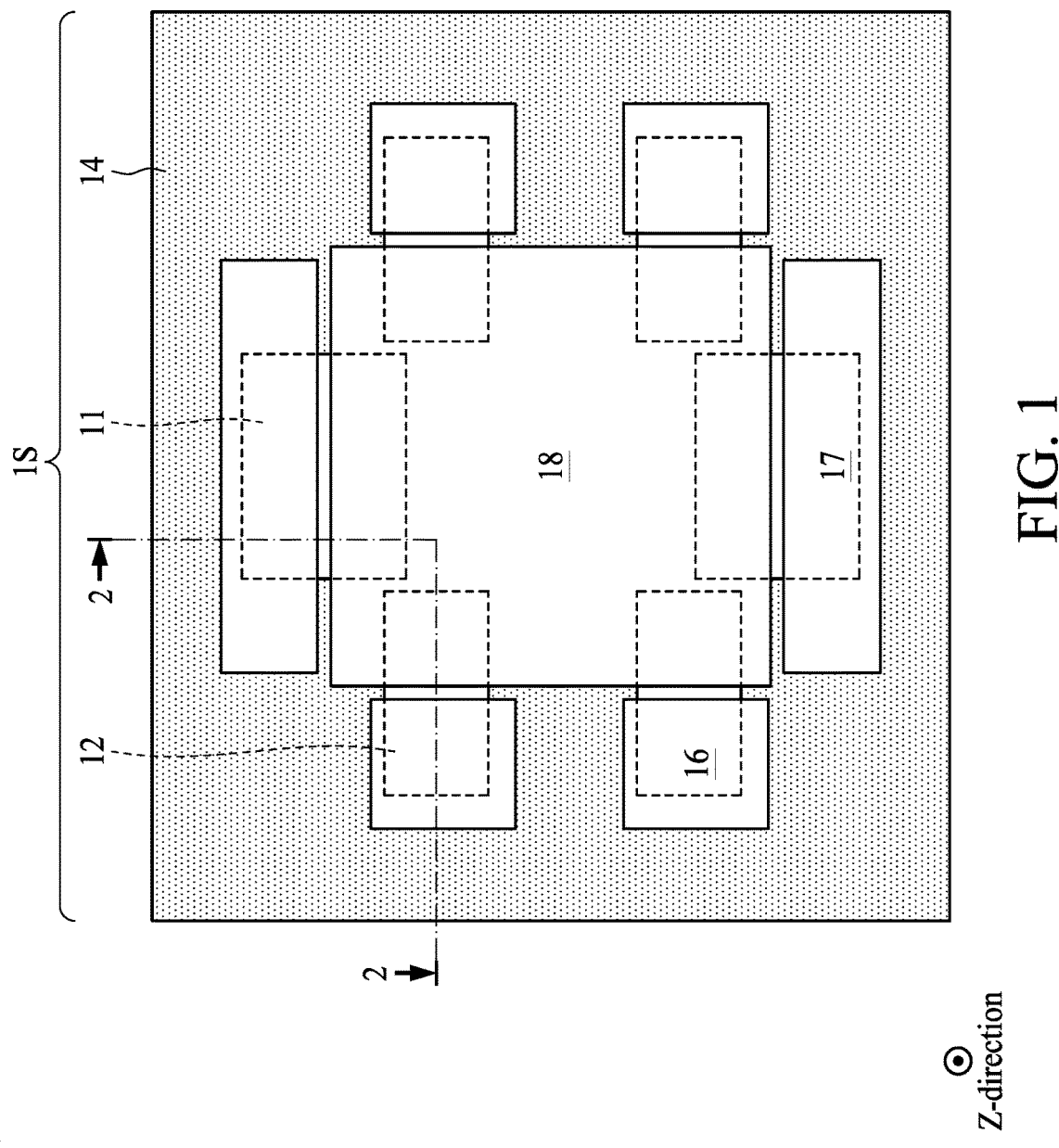
FIG. 1 illustrates a top view of a semiconductor package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
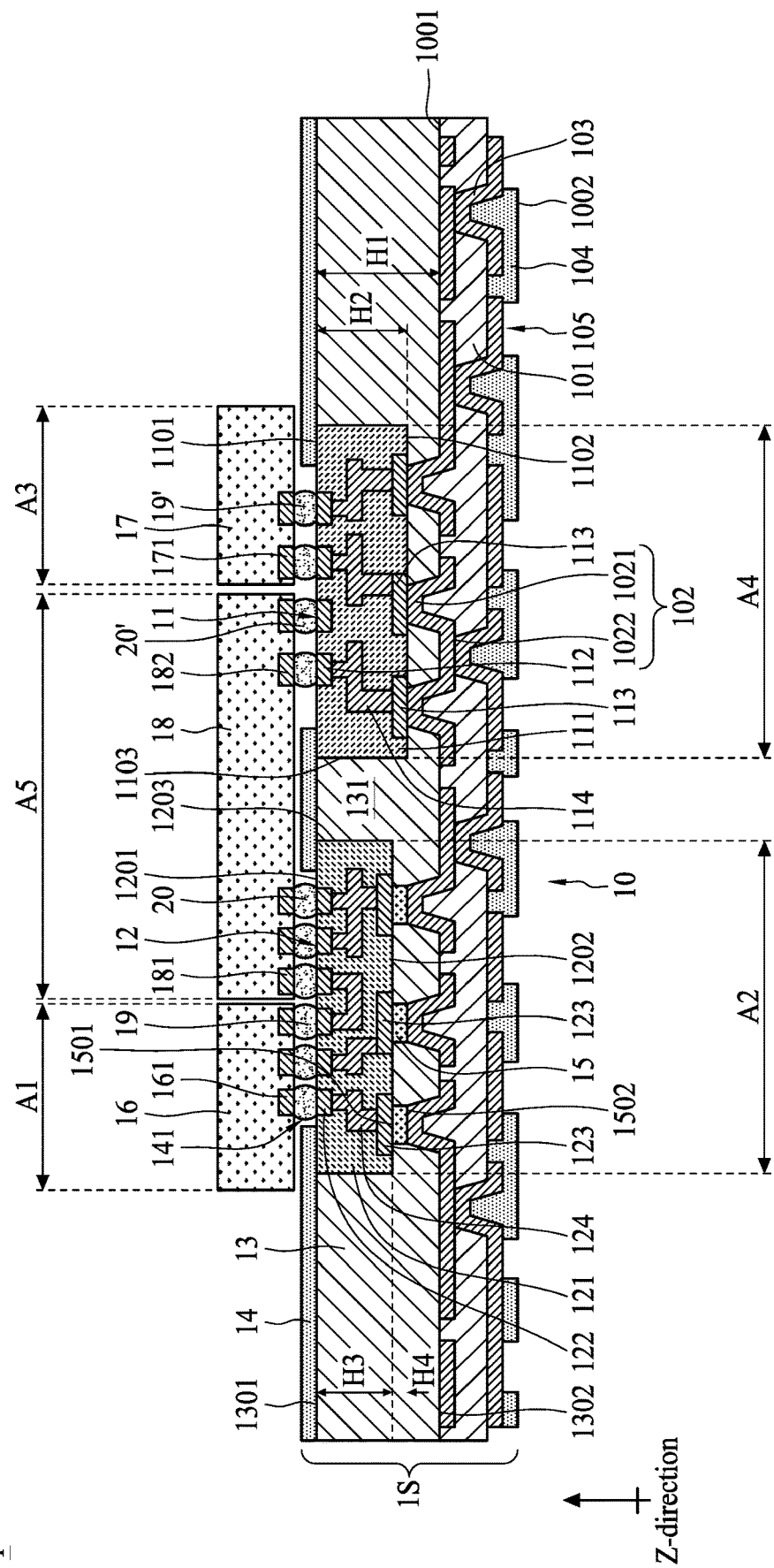
FIG. 2 illustrates a cross-sectional view taken along the line 2-2 of the semiconductor package device of FIG. 1 according to some embodiments of the present disclosure.

FIG. 1 illustrates a top view of a semiconductor package device 1 according to some embodiments of the present disclosure. FIG. 2 illustrates a cross-sectional view taken along line 2-2 of the semiconductor package device 1 of FIG. 1. As shown in FIG. 1 and FIG. 2, the semiconductor package device 1 includes a substrate 1S, a first die 16, a second die 17, a third die 18 and a plurality of first connection elements 19, a plurality of second connection elements 19', a plurality of third connection elements 20 and a plurality of fourth connection elements 20'. The substrate 1S includes a low density wiring structure 10, a first middle density wiring structure 11, a high density wiring structure 12, a dielectric layer 13, a first protection layer 14 and a conductive stud 15.

Referring to FIG. 2, the low density wiring structure 10 includes an insulation layer 101, a first circuit layer 102, a second circuit layer 103 and a protection layer 104. The low density wiring structure 10 has a first surface 1001 and a second surface 1002 opposite to the first surface 1001. The insulation layer 101 is in contact with the first circuit layer 102. The first circuit layer 102 includes a via portion 1021 exposed from the insulation layer 101 and a main portion 1022 embedded within the insulation layer 101. The via portion 1021 and the main portion 1022 may be formed integrally and concurrently. The via portion 1021 has a portion exposed from the first surface 1001 and is embedded in the dielectric layer 13. In some embodiments, the via portion 1021 may have a height in a range from about 5 µm to about 50 µm or a height of about 40 µm. The second circuit layer 103 is disposed on the insulation layer 101. A portion (e.g., a via portion) of the second circuit layer 103 may extend through the insulation layer 101 to contact and electrically connect the first circuit layer 102. The protection layer 104 is disposed on the insulation layer 101 to cover the second circuit layer 103. In addition, the protection layer 104 may define a plurality of openings 105 to expose portions of the second circuit layer 103. In some embodiments, the exposed portions of the second circuit layer 103 may be in contact with connection elements (e.g., solder) to electrically connect to an external printed circuit board (PCB). The first circuit layer 102 or the second circuit layer 103 may be also referred to as "a low density circuit layer." In some embodiments, a density of a circuit line (including, for example, a trace or a pad) of a middle density circuit layer (e.g., a first circuit layer 112 or a third circuit layer 114 of the first middle density wiring structure 11) is greater than a density of a circuit line of the low density circuit layer (e.g., the first circuit layer 102 or the second circuit layer 103 of the low density wiring structure 10). That is, the count of the circuit line (including, for example, a trace or a pad) in a unit area of the middle density circuit layer is greater than the count of the circuit line in an equal unit area of the low density circuit layer, i.e., about 1.2 times or greater, about 1.5 times or greater, or about 2 times or greater. Alternatively, or in combination, a line width/line space (L/S) of the low density circuit layer is greater than an L/S of the middle density circuit layer, such as about 90% or more, about 50% or more, or about 20% or more. Further, the wiring structure that includes the low density circuit layer may be designated as the "low density wiring structure" such as the low density wiring structure 10. In some embodiments, an L/S of the low density wiring structure 10 may be greater than or equal to about 10 µm/about 10 µm.

In some embodiments, the material of the insulation layer 101 may include pre-impregnated composite fibers (e.g., a pre-preg material). Examples of a pre-preg material may include, but are not limited to, a multi-layer structure formed by stacking or laminating a number of pre-impregnated materials (e.g., epoxy resin and glass fiber cloth) or sheets. The insulation layer 101 with pre-impregnated composite fibers provides mechanical support to the low density wiring structure 10. In some embodiments, the material of the first circuit layer 102 and the second circuit layer 103 may each include one or more metal such as copper (Cu), gold (Au), aluminum (Al), titanium (Ti) or the like. In some embodiments, the material of the protection layer 104 may include insulation material, such as solder mask.

Still referring to FIG. 2, the first middle density wiring structure 11 includes a dielectric structure 111, a first circuit layer 112, a second circuit layer 113, a third circuit layer 114. The first middle density wiring structure 11 has a first surface 1101 facing away from the low density wiring structure 10, a second surface 1102 facing toward the low density wiring structure 10 and a lateral surface 1103 extending between the first surface 1101 and the second surface 1102. The first circuit layer 112 including a plurality of conductive pads is adjacent to the first surface 1101. The second circuit layer 113 including a plurality of conductive pads is adjacent to the second surface 1102. The first circuit layer 112, the second circuit layer 113 and the third circuit layer 114 are embedded in the dielectric structure 111. The first circuit layer 112 is electrically connected to the second circuit layer 113 through the third circuit layer 114. As shown in FIG. 2, the high density wiring structure 12 includes a dielectric structure 121, a first circuit layer 122, a second circuit layer 123, a third layer 124. The high density wiring structure 12 has a first surface 1201 facing away from the low density wiring structure 10, a second surface 1202 facing toward the low density wiring structure 10 and a lateral surface 1203 extending between the first surface 1201 and the second surface 1202. The first circuit layer 122 including a plurality of conductive pads is adjacent to the first surface 1201. The second circuit layer 123 including a plurality of conductive pads is adjacent to the second surface 1202. The first circuit layer 122, the second circuit layer 123 and the third circuit layer 124 are embedded in the dielectric structure 121. The first circuit layer 122 is electrically connected to the second circuit layer 123 through the third circuit layer 124. The first circuit layer 112 or the third circuit layer 114 may be also referred to as "a middle density circuit layer." The first circuit layer 122 or the third circuit layer 124 may be also referred to as "a high density circuit layer." In some embodiments, a density of a circuit line (including, for example, a trace or a pad) of a high density circuit layer (e.g., the first circuit layer 122 or the third circuit layer 124) is greater than a density of a circuit line of the middle density circuit layer (e.g., the first circuit layer 112 or the third circuit layer 114). That is, the count of the circuit line (including, for example, a trace or a pad) in a unit area of the high density circuit layer is greater than the count of the circuit line in an equal unit area of the middle density circuit layer, such as about 1.2 times or greater, about 1.5 times or greater, or about 2 times or greater. Alternatively, or in combination, a line width/line space (US) of the middle density circuit layer is greater than a US of the high density circuit layer, such as about 20% or more, about 50% or more, or about 90% or more. Further, the wiring structure that includes the middle density circuit layer may be designated as the "middle density wiring structure" such as the first middle density wiring structure 11, and the wiring structure that includes the high density circuit layer may be designated as a "high density wiring structure" such as the high density wiring structure 12. In some embodiments, an US of the first middle density wiring structure 11 may be in a range from about 2 µm/about 2 µm to about 10 µm/about 10 µm or equal to about 5 µm/about 5 µm. In some embodiments, an US of the high density wiring structure 12 may be smaller than or equal to about 2 µm/about 2 µm.

In some embodiments, the material of the dielectric structure 111 and the dielectric structure 121 may each include, but is not limited to, an organic material such as a molding compound, an epoxy-based material, Ajinomoto build-up film (ABF) or other suitable organic material. In some embodiments, the material of the first circuit layer 112, the second circuit layer 113 and the third circuit layer 114 of the first middle density wiring structure 11 may each include one or more metal such as copper (Cu), gold (Au), aluminum (Al), titanium (Ti) or the like. In some embodiments, the material of the first circuit layer 122, the second circuit layer 123 and the third circuit layer 124 of the high density wiring structure 12 may each include one or more metal such as copper (Cu), gold (Au), aluminum (Al), titanium (Ti) or the like.

Still referring to FIG. 2, the first middle density wiring structure 11 is disposed adjacent to the first surface 1001 of the low density wiring structure 10. The high density wiring structure 12 is disposed adjacent to the first surface 1001 of the low density wiring structure 10. The high density wiring structure 12 and the first middle density wiring structure 11 are disposed side by side. The first middle density wiring structure 11 may be electrically connected to the low density wiring structure 10. For example, the second circuit layer 113 of the first middle density wiring structure 11 may be electrically connected to the first circuit layer 102 of the low density wiring structure 10. Further, the high density wiring structure 12 may be electrically connected to the low density wiring structure 10. For example, the second circuit layer 123 of the high density wiring structure 12 may be electrically connected to the first circuit layer 102 of the low density wiring structure 10.

The dielectric layer 13 is disposed on the first surface 1001 of the low density wiring structure 10. The dielectric layer 13 may be in contact with the first surface 1001 of the low density wiring structure 10. The dielectric layer 13 surrounds and encapsulates the first middle density wiring structure 11 and/or the high density wiring structure 12. Thus, the first middle density wiring structure 11 and/or the high density wiring structure 12 are embedded in the dielectric layer 13. A portion 131 of the dielectric layer 13 is between the first middle density wiring structure 11 and the high density wiring structure 12. The dielectric layer 13 is substantially free of reinforcement element such as glass fiber. That is, the dielectric layer 13 is fiber-less. The dielectric layer 13 may include no reinforcement element such as glass fiber, and may include only a homogeneous resin. In addition, the material of the dielectric layer 13 may include one or more organic materials such as a molding compound, a polyimide (PI), an Ajinomoto build-up film (ABF), an epoxy-based material (e.g., epoxy resin), or a combination of two or more thereof. The fiber-less dielectric layer 13 facilitates the recombination process of the first middle density wiring structure 11 and the high density wiring structure 12.

The dielectric layer 13 has a first surface 1301 facing away from the low density wiring structure 10 and a second surface 1302 facing toward the low density wiring structure 10. The first surface 1301 of the dielectric layer 13 and the first surface 1101 of the first middle density wiring structure 11 are substantially coplanar. The first surface 1301 of the dielectric layer 13 and the first surface 1201 of the high density wiring structure 12 are substantially coplanar. In some embodiments, the first surface 1101 of the first middle density wiring structure 11 and the first surface 1201 of the high density wiring structure 12 are substantially coplanar. The first surface 1101 of the first middle density wiring structure 11, the first surface 1201 of the high density wiring structure 12 and the first surface 1301 of the dielectric layer 13 may form a substantially smooth surface which effectively improves the yield of the bonding process for the first die 16, the second die 17, or third die 18.

The protection layer 14 is disposed on the substantially smooth surface including the first surface 1101 of the first middle density wiring structure 11, the first surface 1201 of the high density wiring structure 12 and the first surface 1301 of the dielectric layer 13. The protection layer 14 covers the surface 1301 of the dielectric layer 13. The protection layer 14 defines a plurality of openings 141 to expose a portion of the first surface 1101 of the first middle density wiring structure 11 and/or a portion of the first surface 1201 of the high density wiring structure 12. In some embodiments, the material of the protection layer 14 may include insulation material, such as solder mask.

As shown in FIG. 2, the dielectric layer 13 has a first height H1, while the first middle density wiring structure 11 has a second height H2 less than the first height H1. The via portion 1021 of the first circuit layer 102 of the low wiring structure 10 compensates for the height difference between the first height H1 and the second height H2, such that the first middle density wiring structure 11 may be electrically connected to the low density wiring structure 10. Furthermore, the high density wiring structure 12 has a third height H3 different from the second height H2. In some embodiments, the second height H2 is greater than the third height H3. The via portion 1021 of the first circuit layer 102 of the low wiring structure 10 may not be enough to compensate for the height difference between the first height H1 and the third height H3. To address this technical problem, the conductive stud 15 with a fourth height H4 interposed between the high density wiring structure 12 and the low density wiring structure 10 further compensates for the distance of a space between the high density wiring structure 12 and the via portion 1021, such that the high density wiring structure 12 may be electrically connected to the low density wiring structure 10 through the conductive stud 15. The conductive stud 15 is surrounded by the dielectric layer 13. The conductive stud 15 has a first surface 1501 facing toward the high density wiring structure 12 and a second surface 1502 facing toward the low density wiring structure 10. As shown in FIG. 2, the second surface 1502 of the conductive stud 15 may be substantially coplanar with the second surface 1102 of the first middle density wiring structure 1. In some embodiments, the conductive stud 15 is in contact with the low density wiring structure 10 and/or the high density wiring structure 12. In some embodiments, the material of the conductive stud 15 may include one or more metal such as copper (Cu), gold (Au), aluminum (Al), titanium (Ti) or the like. In some alternative embodiments, the high density wiring structure 12 and the first middle density wiring structure 11 may have substantially the same height.

Referring to FIG. 2, the first die 16 is disposed on the substrate 1S, and the second die 17 is disposed on the substrate is. In some embodiments, the first die 16 may operate at a first bandwidth (e.g., high bandwidth). In some embodiments, the second die 17 may operate at a second bandwidth (e.g., high-intermediate or intermediate bandwidth). The first bandwidth is higher than the second bandwidth. For example, the first die 16 may operate at bandwidth of around 1 (one) terabyte per second (TB/s) or more. The first die 16 may include, for example but is not limited to, a processor, controller, a high bandwidth memory (HBM) or other semiconductor dies. For example, the second die 17 may operate at a bandwidth of around 100 (one hundred) gigabyte per second (GB/s) or in a range from about 5 GB/s to about 27 GB/s. The second die 17 may include, for example but is not limited to, a processor, a logic die, a Serializer/Deserializer (SerDes) or other semiconductor dies. The third die 18 is disposed on the substrate 1S. The third die 18 may include, for example but is not limited to, a logic die, application-specific integrated circuit (ASIC) die or other semiconductor dies.

The first die 16 is electrically connected to the high density wiring structure 12. For example, the first die 16 has a plurality of conductive pads 161 electrically connected to the first circuit layer 122 of the high density wiring structure 12 through the first connection elements 19. The second die 17 is electrically connected to the first middle density wiring structure 11. For example, the second die 17 has a plurality of conductive pads 171 electrically connected to the first circuit layer 112 of the first middle density wiring structure 11 through the second connection elements 19'. The third die 18 is electrically connected to the high density wiring structure 12 and the first middle density wiring structure 11. For example, the third die 18 has a plurality of first conductive pads 181 electrically connected to the first circuit layer 122 of the high density wiring structure 12 through the third connection elements 20. Further, the third die 18 has a plurality of second conductive pads 182 electrically connected to the first circuit layer 112 of the first middle density wiring structure 11 through the third connection elements 20'. Furthermore, the first die 16 is electrically connected to the low density wiring structure 10 through the high density wiring structure 12. The third die 18 is electrically connected to the first die 16 through the high density wiring structure 12. The second die 17 is electrically connected to the low density wiring structure 10 through the first middle density wiring structure 11. The second die 17 is electrically connected to the third die 18 through the first middle density wiring structure 11. The high density wiring structure 12 with the relatively small L/S (e.g., L/S of about 2 μm/about 2 μm or less) enables the high bandwidth electrical transmission between the first die 16 and the third die 18 or between the first die 16 and the low density wiring structure 10. Meanwhile, the first middle density wiring structure 11 with intermediate US (e.g., US of about 5 μm/about 5 μm) enables the high-intermediate or intermediate bandwidth electrical transmission between the second die 17 and the third die 18 or between the second die 17 and the low density wiring structure 10. The substrate 1S of the semiconductor package device 1 including multi-density wiring structures (e.g., the first middle density wiring structure 11 and the high density wiring structure 12) is compatible with dies which operate at different bandwidths (e.g., the first die 16, the second die 17 and the third die 18). In a comparative embodiment, a semiconductor die may be electrically connected to a packaging substrate through a silicon interposer structure. In another comparative embodiment, a semiconductor die may be electrically connected to another semiconductor die through an embedded bridge interconnection. In the present disclosure, the material of the multi-density wiring structures includes organic material which significantly reduces the manufacturing cost of the semiconductor package device 1.

Referring to FIG. 2, the first die 16 has a first projecting area A1 on the first surface 1001 of the lower wiring structure 10 in the Z-direction, and the high density wiring structure 12 has a second projecting area A2 on the first surface 1001 of the lower wiring structure 10 in the Z-direction. The first projecting area A1 is overlapped with the second projecting area A2. Furthermore, the second die 17 has a third projecting area A3 on the first surface 1001 of the lower wiring structure 10 in the Z-direction, and the first middle density wiring structure 11 has a second projecting area A4 on the first surface 1001 of the lower wiring structure 10 in the Z-direction. The third projecting area A3 is overlapped with the fourth projecting area A4. Furthermore, the third die 18 has a fifth projecting area A5 on the first surface 1001 of the lower wiring structure 10 in the Z-direction. The fifth projecting area A5 is overlapped with the second projecting area A2 and/or the fourth projecting area A4.

Figure 3:
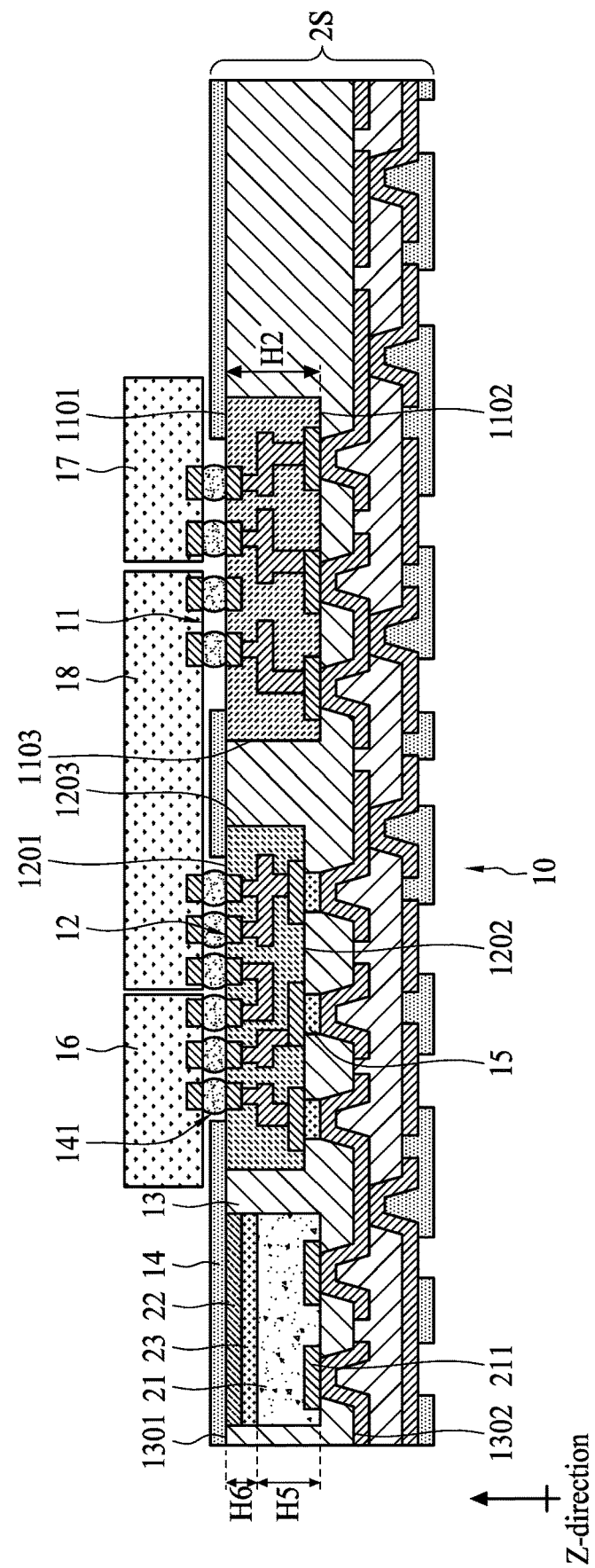
FIG. 3 illustrates a cross-sectional view of a semiconductor package device according to some embodiments of the present disclosure.

FIG. 3 illustrates a cross-sectional view of a semiconductor package device 2 according to some embodiments of the present disclosure. The semiconductor package device 2 is similar to the semiconductor package device 1 in FIG. 2, except that a substrate 2S of the semiconductor package device 2 further includes a device 21 disposed on the low density wiring structure 10. The device 21 and the high density wiring structure 12 are disposed side by side. In some alternative embodiments, the device 21 and the first middle density wiring structure 11 may be disposed side by side. As shown in FIG. 3, a spacer 22 is disposed on the device 21 through an adhesive layer 23. The device 21 has a fifth height H5, and the spacer 22 and adhesive layer jointly have a sixth height H6. The sum of the fifth height H5 and the sixth height H6 are substantially equal to the second height H2. That is, the spacer 22 and the adhesive layer 23 jointly compensate the height difference between the device 21 and the first middle density wiring structure 11, such that the device 21 can be electrically connected to the low density wiring structure 10. For example, the device 21 includes a plurality of conductive pads 211 electrically connected to the via portion 1021 of the first circuit layer 102 of the low density wiring structure 10. The device 21 may include a passive electronic component such as a capacitor, an inductor or a resistor. The device 21 may include an active electronic component such as a transistor or a diode. The device 21 may operate at an intermediate-low or low bandwidth. For example, the device 21 may operate at bandwidth in a megabyte per second (MB/s) scale. The low density wiring structure 10 with relatively large US (e.g., US of about 10 μm/about 10 μm or more) enables the intermediate-low or low bandwidth electrical transmission between the device 21 and an external PCB. The substrate 2S of the semiconductor package device 1 including multi-density wiring structures (e.g., the first middle density wiring structure 11, the high density wiring structure 12 and the low density wiring structure 10) is compatible with dies (e.g., the first die 16, the second die 17 and the third die 18) and the device 21 which respectively operate at different bandwidths.

Figure 4:
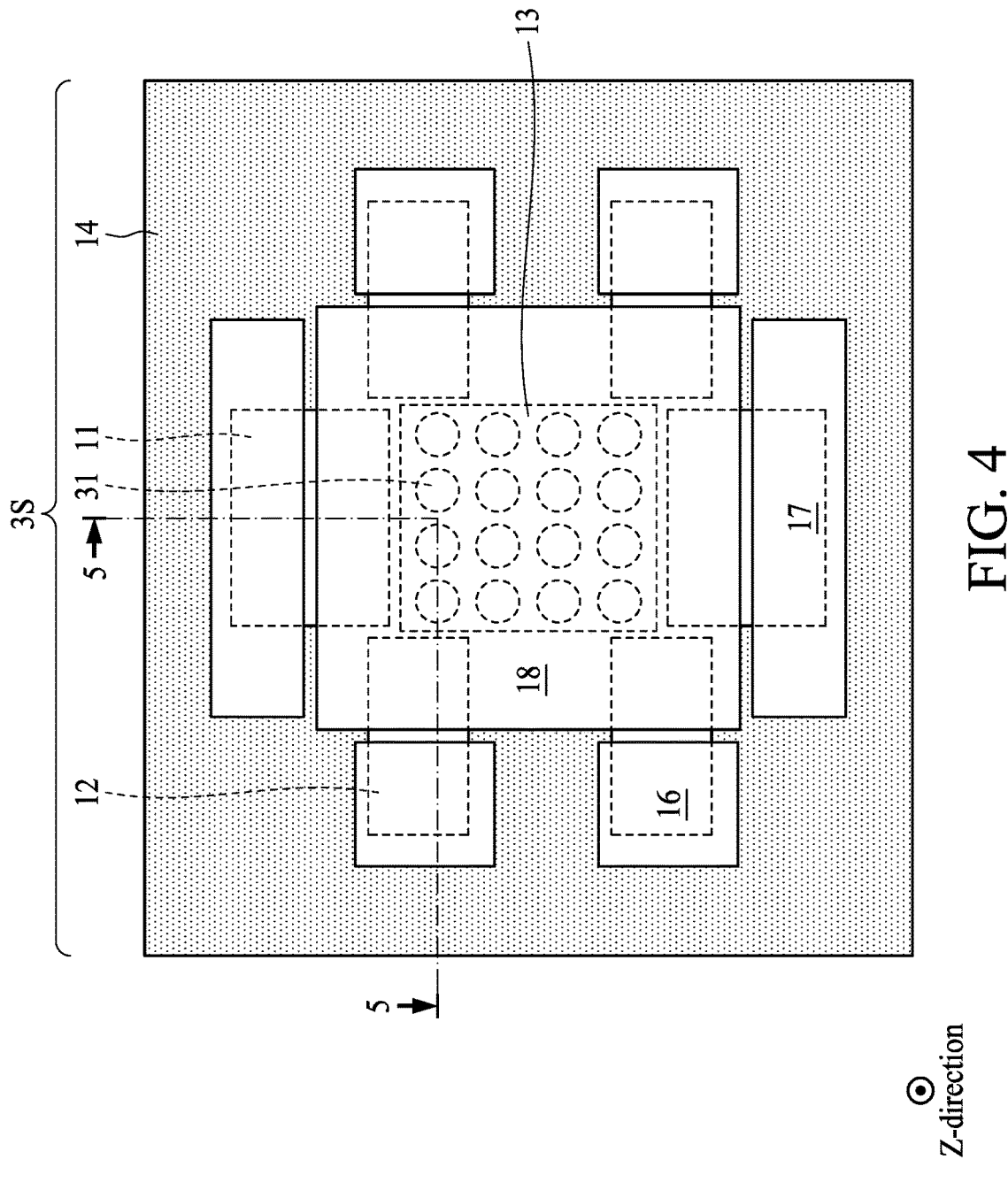
FIG. 4 illustrates a top view of a semiconductor package device according to some embodiments of the present disclosure.
Figure 5:
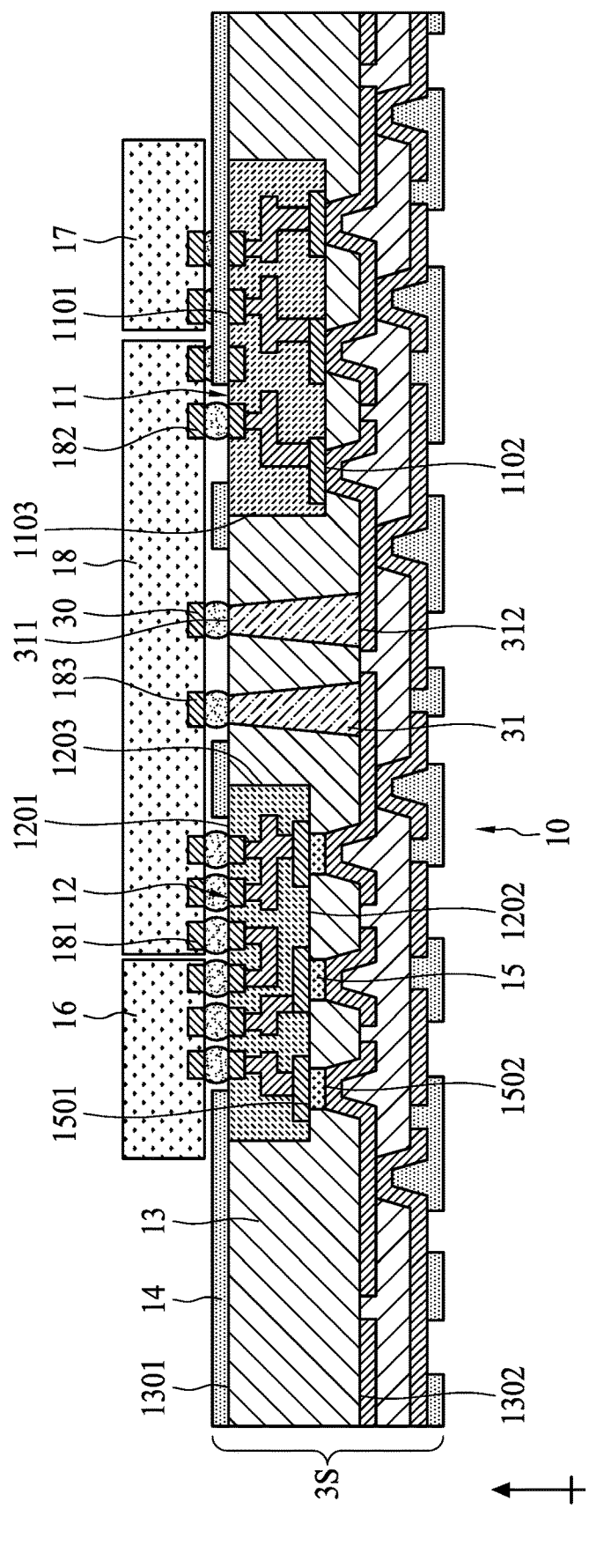
FIG. 5 illustrates a cross-sectional view of taken along the line 5-5 of the semiconductor package device of FIG. 4 according to some embodiments of the present disclosure.

FIG. 4 illustrates a top view of a semiconductor package device 3 according to some embodiments of the present disclosure. FIG. 5 illustrates a cross-sectional view taken along line 5-5 of the semiconductor package device 3 of FIG. 4. The semiconductor package device 3 is similar to the semiconductor package device 1 in FIG. 1 and FIG. 2, except that a substrate 3S of the semiconductor package device 3 further includes a plurality of through-vias 31 disposed on the low density wiring structure 10 and extending through the dielectric layer 13. As shown in FIG. 5, each of the through-vias 31 has a first surface 311 facing away from the low density wiring structure 10 and a second surface 312 facing toward the low density wiring structure 10. Each of the through-vias 31 has a tapper profile. For instance, each of the through-vias 31 has a portion adjacent to the second surface 312 wider than another portion adjacent to the first surface 311. The third die 18 includes a plurality of conductive pad 183 electrically connected to the through-vias 31 through a plurality of fifth connection elements 30. Each of the through-vias 31 is disposed right under the third die 18 and electrically connected to the low density wiring structure 10. As a result, the substrate 3S with the through-vias 31 provides a direct transmission path between the third die 18 and the low density wiring structure 10.

Figure 6:
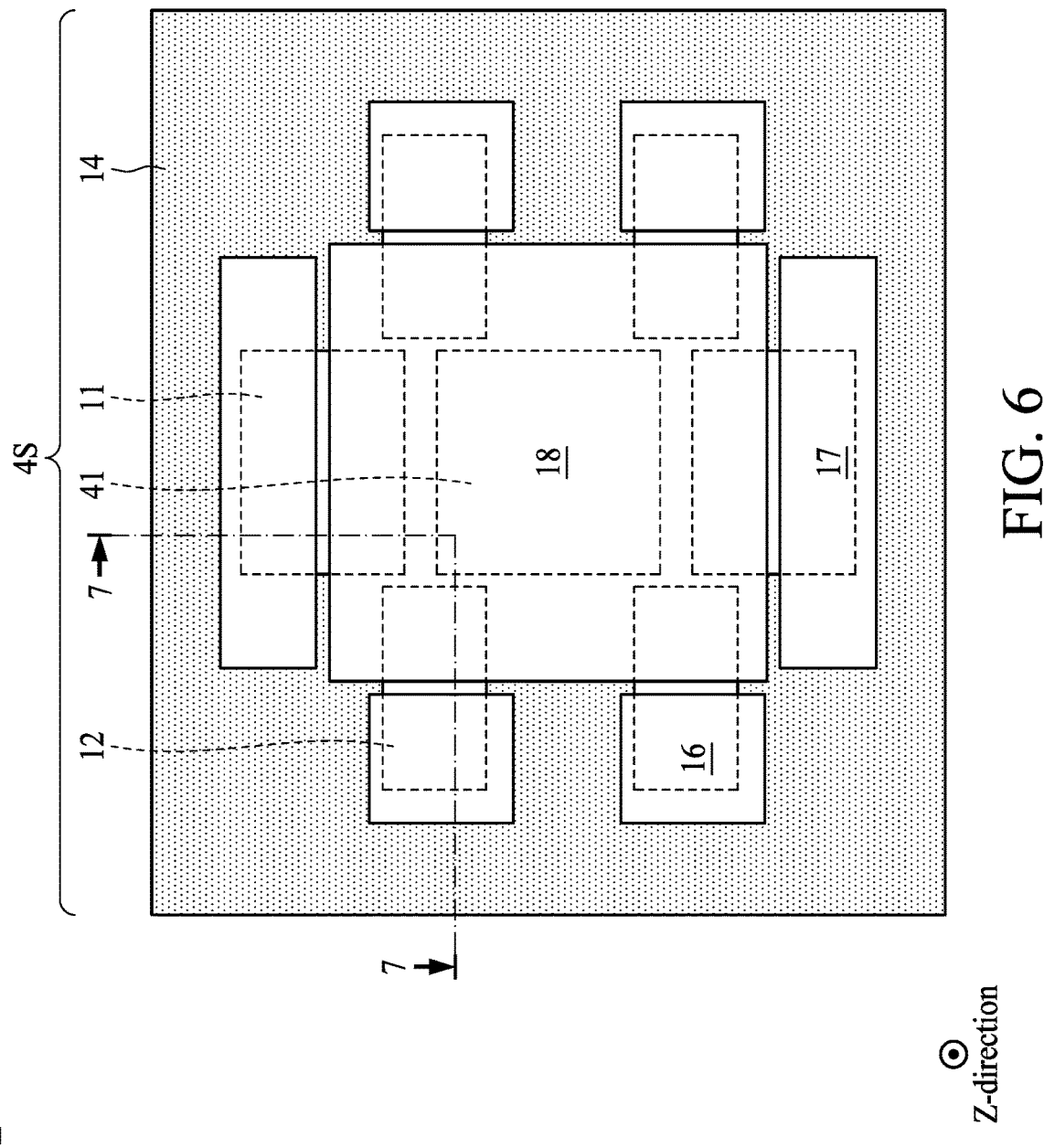
FIG. 6 illustrates a top view of a semiconductor package device according to some embodiments of the present disclosure.
Figure 7:
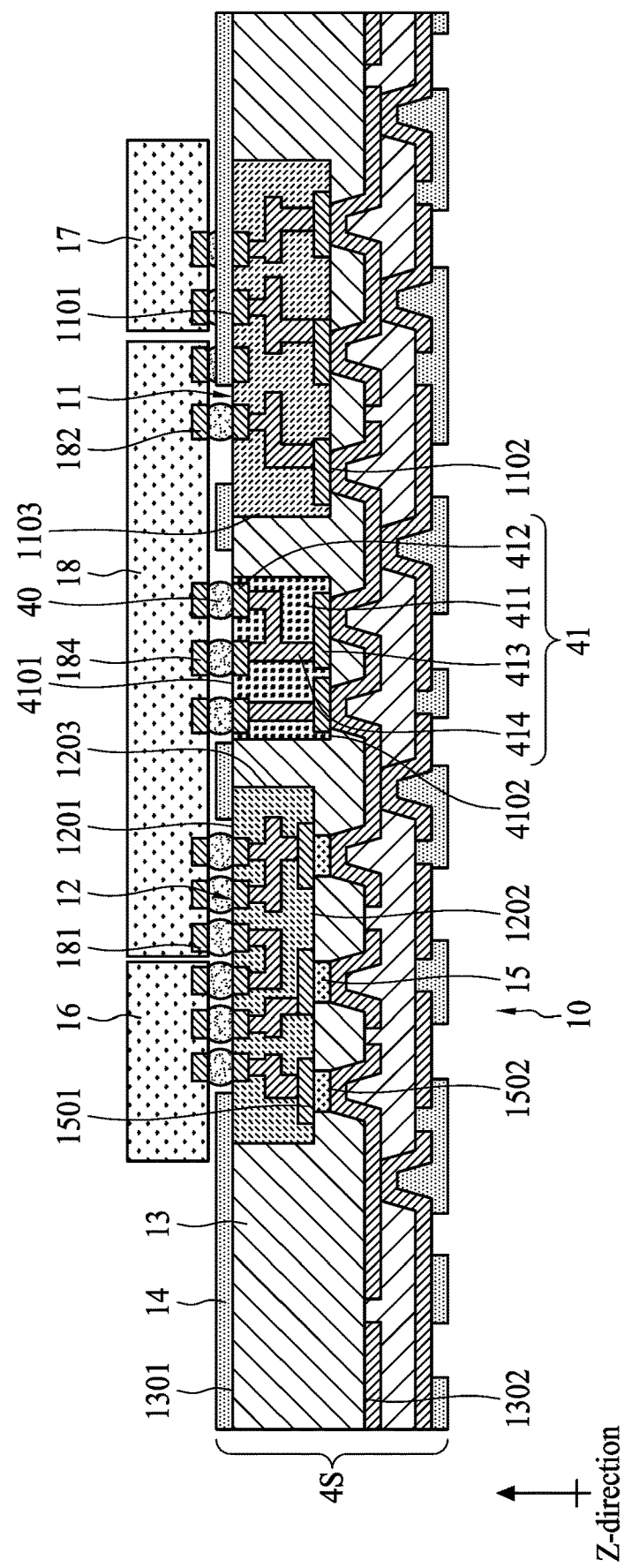
FIG. 7 illustrates a cross-sectional view of taken along the line 7-7 of the semiconductor package device of FIG. 6 according to some embodiments of the present disclosure.

FIG. 6 illustrates a top view of a semiconductor package device 4 according to some embodiments of the present disclosure. FIG. 7 illustrates a cross-sectional view taken along line 7-7 of the semiconductor package device 4 of FIG. 6. The semiconductor package device 4 is similar to the semiconductor package device 1 in FIG. 1 and FIG. 2, except that a substrate 4S of the semiconductor package device 4 further includes a second middle density wiring structure 41 disposed on the low density wiring structure 10. The second middle density wiring structure 41 is disposed between the first density middle wiring structure 11 and the high density wiring structure 12. The second middle density wiring structure 41 is electrically connected to the low density wiring structure 10. The second middle density wiring structure 41 includes a dielectric structure 411, a first circuit layer 412, a second circuit layer 413, a third circuit layer 414. The second middle density wiring structure 41 has a first surface 4101 facing away from the low density wiring structure 10, a second surface 4102 facing toward the low density wiring structure 10 and a lateral surface 4103 extending between the first surface 4101 and the second surface 4102. The first circuit layer 412 including a plurality of conductive pads is adjacent to the first surface 4101. The second circuit layer 413 including a plurality of conductive pads is adjacent to the second surface 4102. The first circuit layer 412, the second circuit layer 413 and the third circuit layer 414 are embedded in the dielectric structure 411. The first circuit layer 412 is electrically connected to the second circuit layer 413 through the third circuit layer 414. The first circuit layer 412 or third circuit layer 414 may be also referred to as "a middle density circuit layer." In some embodiments, a line width/line space (line space, L/S) of the first circuit layer 412 and third circuit layer 414 may be equal to or greater than that of the circuit layer (e.g., the first circuit layer 112 and third circuit layer 114) of the first middle density wiring structure 11.

As shown in FIG. 7, the third die 18 includes a plurality of conductive pad 184 electrically connected to the second middle density wiring structure 41 through a sixth plurality connection elements 40. The substrate 4S with the second middle density wiring structure 41 provides a direct transmission path between the third die 18 and the low density wiring structure 10. For example, the second middle density wiring structure 41 transmits the input/output signals, power signals or ground signals between the third die 18 and the low density wiring structure 10.

In some embodiments, the material of the dielectric structure 411 may include, but is not limited to, a molding compound, an epoxy-based material, Ajinomoto build-up film (ABF) or other suitable organic material. In some embodiments, the material of the first circuit layer 412, the second circuit layer 413 and the third circuit layer 414 of the second middle density wiring structure 11 may each include one or more metal such as copper (Cu), gold (Au), aluminum (Al), titanium (Ti) or the like.

Figure 8:
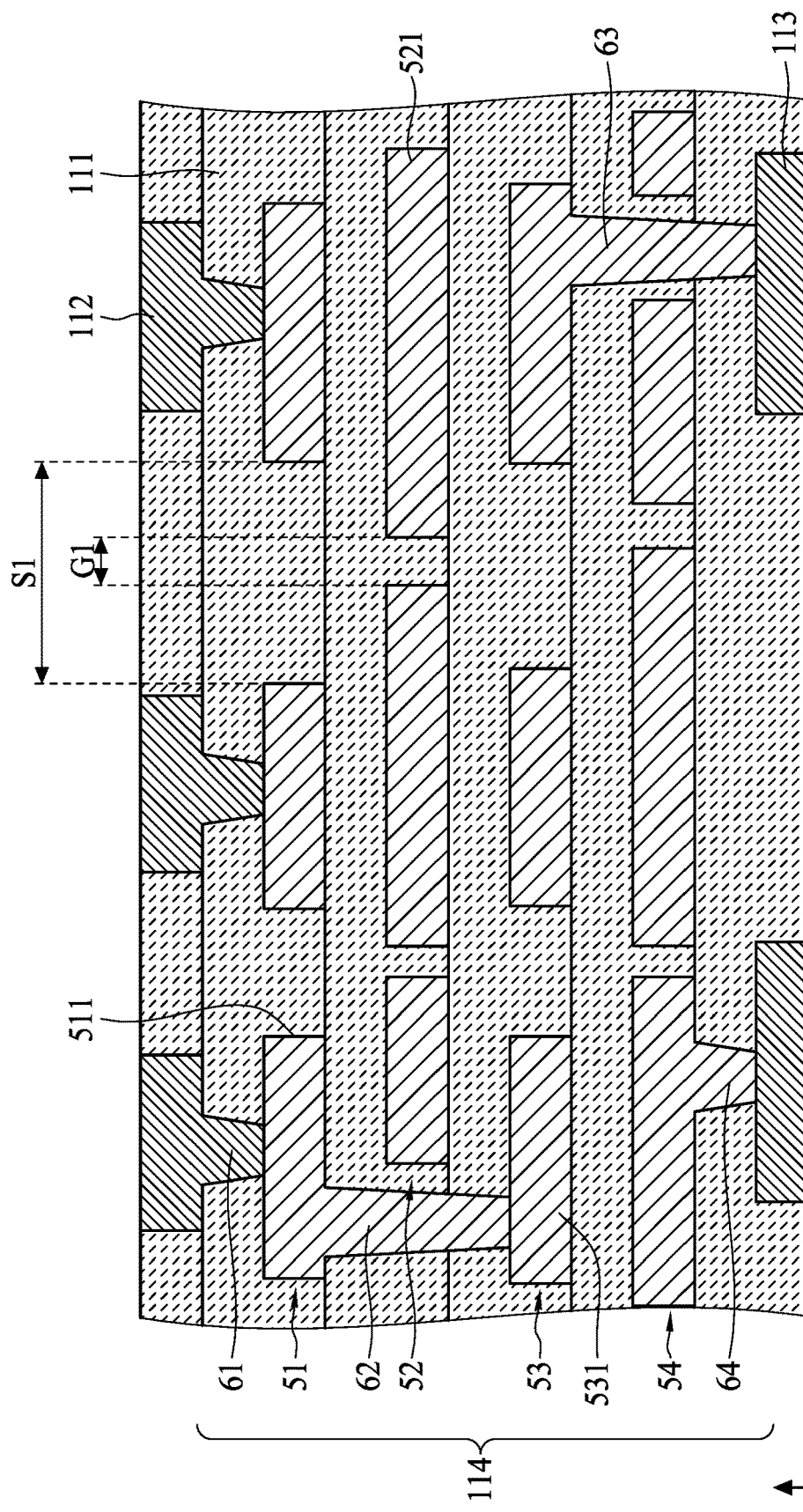
FIG. 8 illustrates an enlarged cross-sectional view an example of a portion of the first middle density wiring structure of the semiconductor package device of FIG. 2 according to some embodiments of the present disclosure.

FIG. 8 illustrates an enlarged cross-sectional view an example of a portion of the first middle density wiring structure 11 of the semiconductor package device 1 of FIG. 2 according to some embodiments of the present disclosure. The third circuit layer 114 may include a first metal layer 51, a second metal layer 52, a third metal layer 53 and a fourth metal layer 54. Further, the third circuit layer 114 may further include at least one first conductive via 61, at least one second conductive via 62, at least one third conductive via 63 and at least one fourth conductive via 64. The first circuit layer 112 may be electrically connected to the first metal layer 51 through the first conductive via 61. In some embodiments, the first circuit layer 112 and the first conductive via 61 may be formed integrally and concurrently.

Further, the first metal layer 51 may be electrically connected to the third metal layer 53 through the second conductive via 62. In some embodiments, the first metal layer 51 and the second conductive via 62 may be formed integrally and concurrently. Further, the third metal layer 53 may be electrically connected to the second circuit layer 113 through the third conductive via 63. In some embodiments, the third metal layer 53 and the third conductive via 63 may be formed integrally and concurrently. Further, the fourth metal layer 54 may be electrically connected to the second circuit layer 113 through the fourth conductive via 64. In some embodiments, the fourth metal layer 54 and the fourth conductive via 64 may be formed integrally and concurrently.

The first metal layer 51 and the third metal layer 53 may be used to transmit data signal so that they are also referred to as transmission layers. For example, the first metal layer 51 may be a patterned layer that includes a plurality of traces 511 or pads. The traces 511 may be separated with each other with a first space S1, which may be filled with a dielectric material. An L/S of the traces 511 of the first metal layer 51 may be in a range from about 2 μm/about 2 μm to about 10 μm/about 10 μm or equal to about 5 μm/about 5 μm. Further, the third metal layer 53 may be a patterned layer that includes a plurality of traces 531 or pads. An US of the traces 531 of the third metal layer 53 may be in a range from about 2 μm/about 2 μm to about 10 μm/about 10 μm or equal to about 5 μm/about 5 μm.

The second metal layer 52 is disposed below the first metal layer 51. The fourth metal layer 54 is disposed below the third metal layer 53. The second metal layer 52 and the fourth metal layer 54 may be power/ground planes that provide power/ground so they are also referred to as power/ground layers. Further, the second metal layer 52 may be a patterned layer that includes a plurality of metal blocks 521. A first gap G1 is between the metal blocks 521. The first space S1 may be right above the first gap G1. The first space S1 may be substantially aligned with the first gap G1 in the Z-direction. Alternatively, the area of the second metal layer 52 may fully cover one or more traces 511 of the first metal layer 51 in the Z-direction. In some embodiments, the area of the fourth metal layer 54 may fully cover one or more traces 531 of the third metal layer 53 in the Z-direction. In some embodiments, the power/ground layer may be a solid metal layer or a blanket metal layer, and thus the first gap G1 may not exist.

Figure 9B:
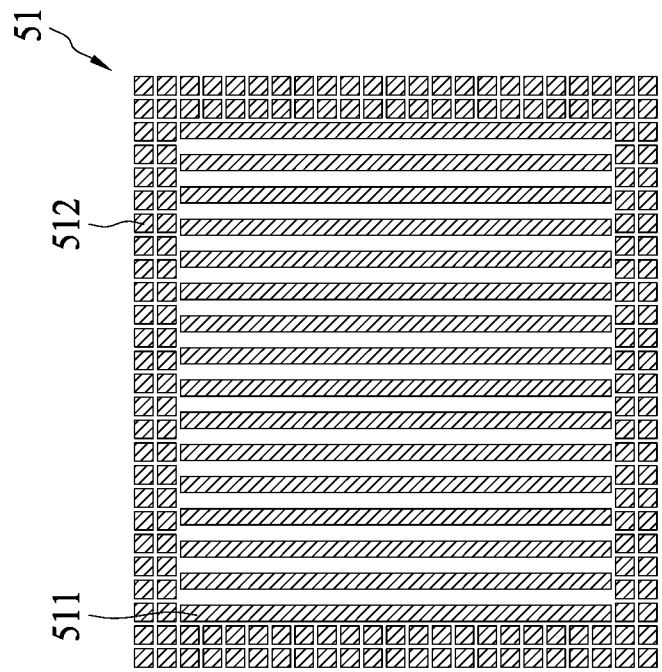
FIG. 9B illustrates a top view of an example of a transmission layer of the first middle density wiring structure of the semiconductor package device of FIG. 2 according to some embodiments of the present disclosure.
Figure 9A:
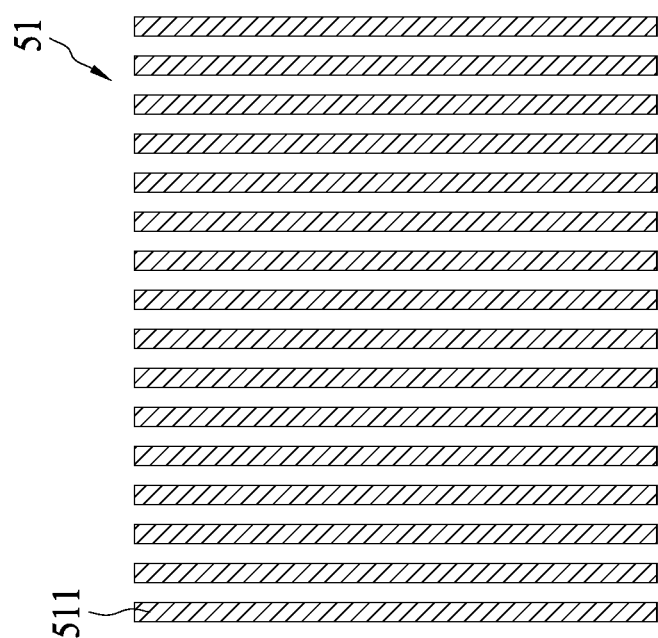
FIG. 9A illustrates a top view of an example of a transmission layer of the first middle density wiring structure of the semiconductor package device of FIG. 2 according to some embodiments of the present disclosure.

FIG. 9A illustrates a top view of an example of a transmission layer of the first middle density wiring structure 11 of the semiconductor package device 1 of FIG. 2 according to some embodiments of the present disclosure. As shown in FIG. 9A, the transmission layer (e.g., the first metal layer 51) may be a patterned layer that includes a plurality of traces (e.g., the plurality of traces 511). In some embodiments, the third metal layer 53 may be a patterned layer similar to the transmission layer as shown in FIG. 9A.

FIG. 9B illustrates a top view of an example of a transmission layer of the first middle wiring structure 11 of the semiconductor package device 1 of FIG. 2 according to some embodiments of the present disclosure. As shown in FIG. 9B, the transmission layer (e.g., the first metal layer 51) may be a pattern layer that includes a plurality of traces (e.g., the plurality of traces 511) and a meshed-patterned portion 512 surrounding the traces 511. The mesh-patterned portion 512 may transmit the ground signal or power signal to a ground layer below the transmission layer through a plurality of via. For example, a density of a total area of a metal portion in a unit region of the mesh-patterned portion 512 may be in a range from about 20% to about 60%. In some embodiments, the third metal layer 53 may be a patterned layer similar to the transmission layer as shown in FIG. 9B.

Figure 10C:
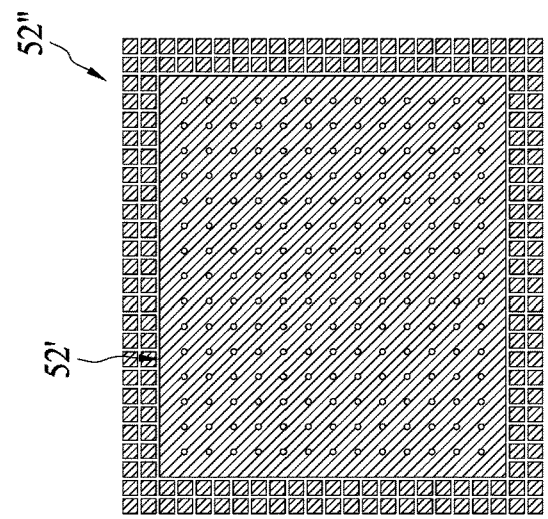
FIG. 10C illustrates a top view of an example of a ground layer of the first middle density wiring structure of the semiconductor package device of FIG. 2 according to some embodiments of the present disclosure.
Figure 10B:
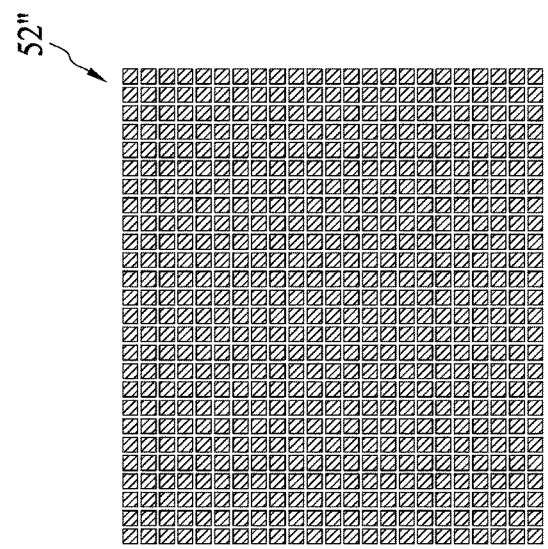
FIG. 10B illustrates a top view of an example of a ground layer of the first middle density wiring structure of the semiconductor package device of FIG. 2 according to some embodiments of the present disclosure.
Figure 10A:
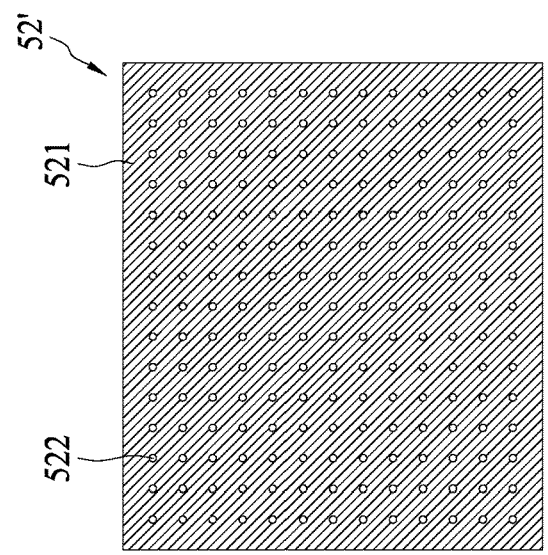
FIG. 10A illustrates a top view of an example of a ground layer of the first middle density wiring structure of the semiconductor package device of FIG. 2 according to some embodiments of the present disclosure.

FIG. 10A illustrates a top view of an example of a power/ground layer of the first middle density wiring structure 11 of the semiconductor package device 1 of FIG. 2 according to some embodiments of the present disclosure. As shown in FIG. 10A, the power/ground layer (e.g., the second metal layer 52 and the fourth metal layer 54) has an inversely dot-patterned portion 52'. The inversely dot-patterned portion 52' may transmit the ground signal or power signal. The inversely dot-patterned portion 52' may include a solid metal portion 521 and define a plurality of through holes 522 extending through the solid metal portion 521. In some embodiments, a dielectric material may be disposed within the plurality of through holes 522. For example, a ratio of the area of the solid metal portion 521 to the entire area of the inversely dot-patterned portion 52' may be in a range from about 40% to about 80%.

FIG. 10B illustrates a top view of an example of a power/ground layer of the first middle density wiring structure 11 of the semiconductor package device 1 of FIG. 2 according to some embodiments of the present disclosure. As shown in FIG. 10B, the power/ground layer (e.g., the second metal layer 52 and the fourth metal layer 54) has a mesh-patterned portion 52". The mesh-patterned portion 52" may transmit the ground signal or power signal. The mesh-patterned portion 52' may include a plurality of metal blocks spaced with each other and arranged in an array. For example, a density of a total area of a metal portion (i.e., the metal blocks) in a unit region of the mesh-patterned portion 52" may be in a range from about 20% to about 60%.

FIG. 10C illustrates a top view of an example of a power/ground layer of the first middle density wiring structure 11 of the semiconductor package device 1 of FIG. 2 according to some embodiments of the present disclosure. As shown in FIG. 10C, the ground layer (e.g., the second metal layer 52 and the fourth metal layer 54) has the mesh-patterned portion 52" and the inversely dot-patterned portion 52' surrounded by the mesh-patterned portion 52". The mesh-patterned portion 52" and the inversely dot-patterned portion 52' may each transmit the ground signal or power signal. For example, a density of a total area of a metal portion (i.e., the metal blocks) in a unit region of the mesh-patterned portion may be in a range from about 20% to about 60%. For example, a ratio of the area of the solid metal portion 521 to the entire area of the inversely dot-patterned portion 52' may be in a range from about 40% to about 80%. In some embodiments, a total area of a metal portion in an unit region of the inversely dot-patterned portion 52' is greater than a total area of a metal portion in an equal unit region of the mesh-patterned portion 52" from a top view. The relatively low density (or relatively large total area of a metal portion in a unit region) of the mesh-patterned portion 52" may improve the warpage of the first middle density wiring structure 11.

Figure 11:
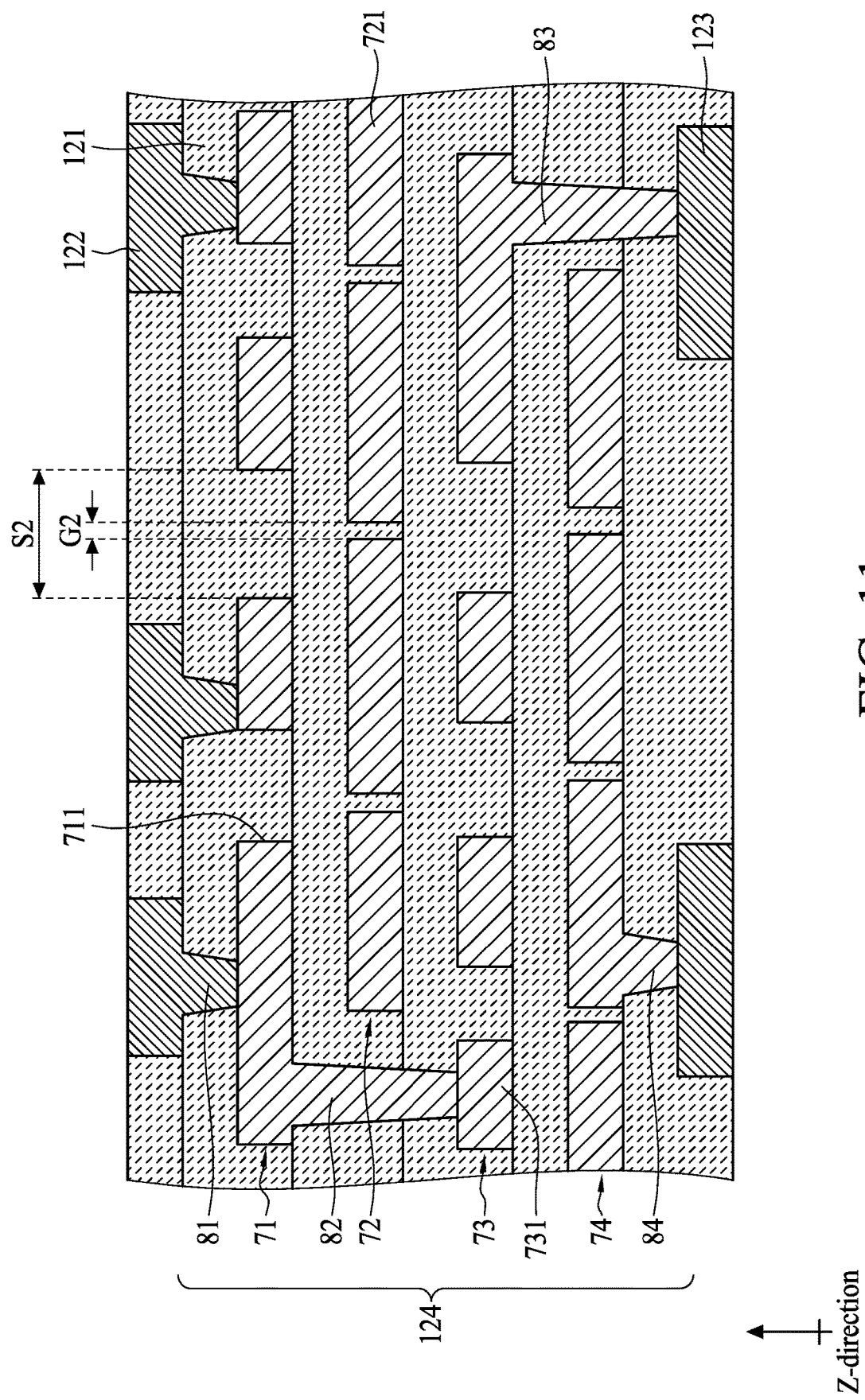
FIG. 11 illustrates an enlarged cross-sectional view an example of a portion of the high density wiring structure of the semiconductor package device of FIG. 2 according to some embodiments of the present disclosure.

FIG. 11 illustrates an enlarged cross-sectional view an example of a portion of the high density wiring structure 12 of the semiconductor package device 1 of FIG. 2 according to some embodiments of the present disclosure. The third circuit layer 124 may include a first metal layer 71, a second metal layer 72, a third metal layer 73 and a fourth metal layer 74. Further, the third circuit layer 124 may further include at least one first conductive via 81, at least one second conductive via 82, at least one third conductive via 83 and at least one fourth conductive via 84. The first circuit layer 122 may be electrically connected to the first metal layer 71 through the first conductive via 81. In some embodiments, the first circuit layer 122 and the first conductive via 81 may be formed integrally and concurrently. Further, the first metal layer 71 may be electrically connected to the third metal layer 73 through the second conductive via 82. In some embodiments, the first metal layer 71 and the second conductive via 82 may be formed integrally and concurrently. Further, the third metal layer 73 may be electrically connected to the second circuit layer 123 through the third conductive via 83. In some embodiments, the third metal layer 73 and the third conductive via 83 may be formed integrally and concurrently. Further, the fourth metal layer 74 may be electrically connected to the second circuit layer 123 through the fourth conductive via 84. In some embodiments, the fourth metal layer 74 and the fourth conductive via 84 may be formed integrally and concurrently.

The first metal layer 74 and the third metal layer 74 may be used to transmit data signal so that they are also referred to as transmission layers. For example, the first metal layer 51 may be a patterned layer that includes a plurality of traces 711 or pads. The traces 711 may be separated with each other with a second space S2, which may be filled with a dielectric material. An L/S of the traces 711 of the first metal layer 71 may be equal to or less than about 2 μm/about 2 μm. Further, the third metal layer 73 may be a patterned layer that includes a plurality of traces 731 or pads. An L/S of the traces 731 of the third metal layer 73 may be equal to or less than about 2 μm/about 2 μm.

The second metal layer 72 is disposed below the first metal layer 71. The fourth metal layer 74 is disposed below the third metal layer 73. The second metal layer 72 and the fourth metal layer 74 may be power/ground planes that provide power/ground so they are also referred to as power/ground layers. Further, the second metal layer 72 may be a patterned layer that includes a plurality of metal blocks 721. A second gap G2 is between the metal blocks 721. The second space S2 may be right above the second gap G2. The second space S2 may be substantially aligned with the second gap G2 in the Z-direction. Alternatively, the area of the second metal layer 72 may fully cover one or more traces 711 of the first metal layer 71 in the Z-direction. In some embodiments, the area of the fourth metal layer 74 may fully cover one or more traces 731 of the third metal layer 73 in the Z-direction. In some embodiments, the power/ground layer may be a solid metal layer or a blanket metal layer, and thus the second gap G2 may not exist.

Figure 12B:
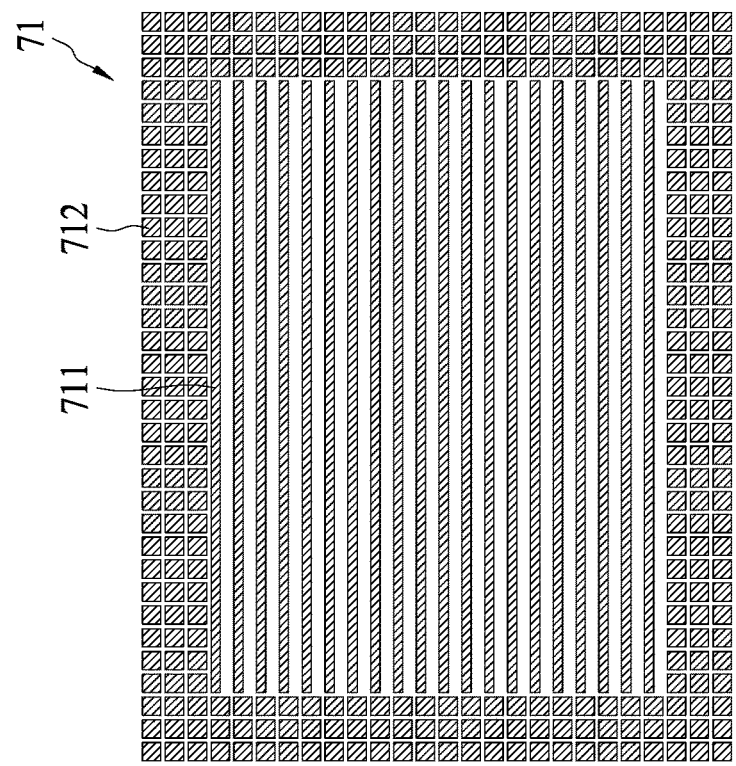
FIG. 12B illustrates a top view of an example of a transmission layer of the high density wiring structure of the semiconductor package device of FIG. 2 according to some embodiments of the present disclosure.
Figure 12A:
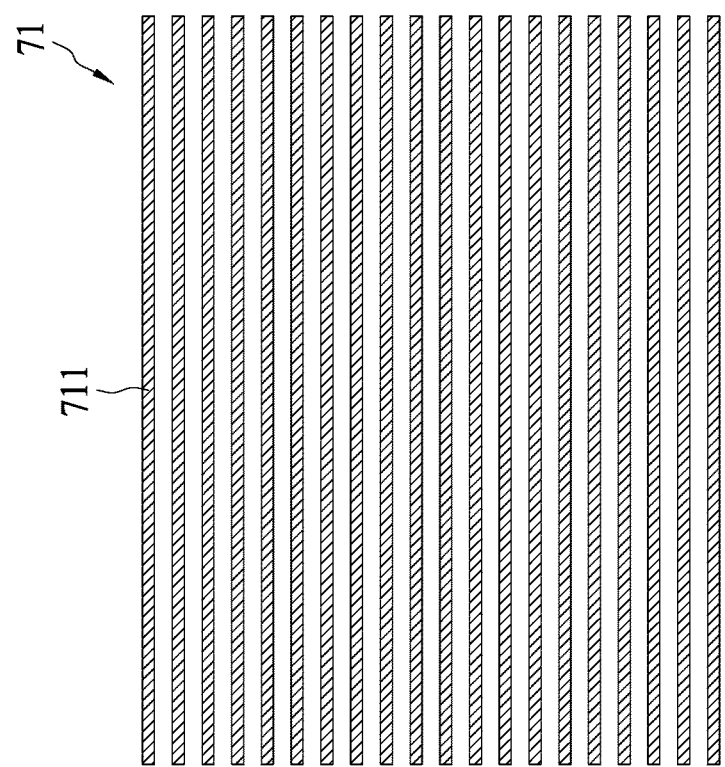
FIG. 12A illustrates a top view of an example of a transmission layer of the high density wiring structure of the semiconductor package device of FIG. 2 according to some embodiments of the present disclosure.

FIG. 12A illustrates a top view of an example of a transmission layer of the high density wiring structure 12 of the semiconductor package device 1 of FIG. 2 according to some embodiments of the present disclosure. As shown in FIG. 12A, the transmission layer (e.g., the first metal layer 71) may be a patterned layer that includes a plurality of traces (e.g., the plurality of traces 711). In some embodiments, the third metal layer 73 may be a patterned layer similar to the transmission layer as shown in FIG. 12A.

FIG. 12B illustrates a top view of an example of a transmission layer of the high density wiring structure 12 of the semiconductor package device 1 of FIG. 2 according to some embodiments of the present disclosure. As shown in FIG. 12B, the transmission layer (e.g., the first metal layer 71) may be a pattern layer that includes a plurality of traces (e.g., the plurality of traces 711) and a meshed-patterned portion 712 surrounding the traces 711. The mesh-patterned portion may transmit the ground signal or power signal to a ground layer below the transmission layer through a plurality of via. A density of a total area of a metal portion in a unit region of the mesh-patterned portion may be in a range from about 20% to about 60%. In some embodiments, the third metal layer 73 may be a patterned layer similar to the transmission layer as shown in FIG. 12B.

Figure 13C:
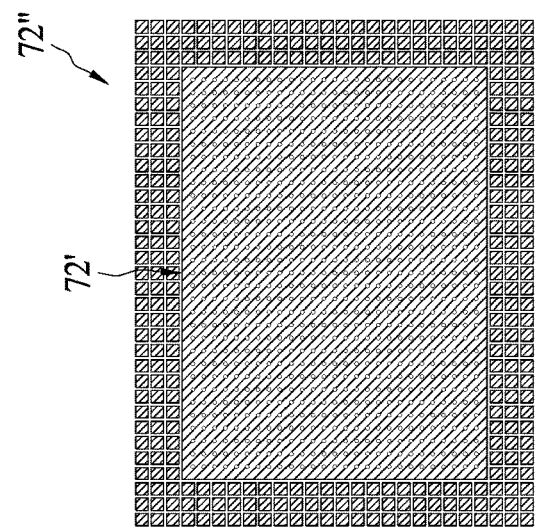
FIG. 13C illustrates a top view of an example of a ground layer of the high density wiring structure of the semiconductor package device of FIG. 2 according to some embodiments of the present disclosure.
Figure 13B:
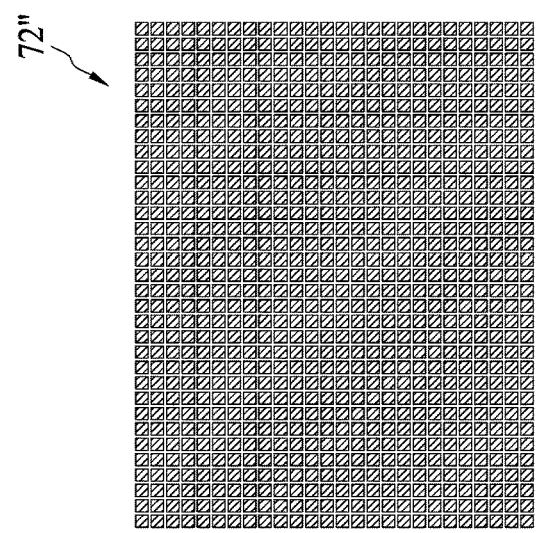
FIG. 13B illustrates a top view of an example of a ground layer of the high density wiring structure of the semiconductor package device of FIG. 2 according to some embodiments of the present disclosure.
Figure 13A:
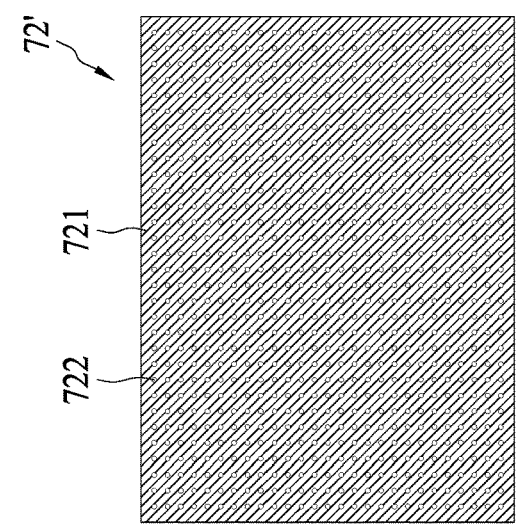
FIG. 13A illustrates a top view of an example of a ground layer of the high density wiring structure of the semiconductor package device of FIG. 2 according to some embodiments of the present disclosure.

FIG. 13A illustrates a top view of an example of a ground layer of the high density wiring structure 12 of the semiconductor package device 1 of FIG. 2 according to some embodiments of the present disclosure. As shown in FIG. 13A, the power/ground layer (e.g., the second metal layer 72 and the fourth metal layer 74) has an inversely dot-patterned portion 72'. The inversely dot-patterned portion 72' may transmit the ground signal or power signal. The inversely dot-patterned portion 72' may include a solid metal portion 721 and define a plurality of through holes 722 extending through the solid metal portion 721. In some embodiments, a dielectric material may be disposed within the plurality of through holes 722. For example, a ratio of the area of the solid metal portion 721 to the entire area of the inversely dot-patterned portion 72' may be in a range from about 60% to about 100%.

FIG. 13B illustrates a top view of an example of a ground layer of the high density wiring structure 12 of the semiconductor package device 1 of FIG. 2 according to some embodiments of the present disclosure. As shown in FIG. 13B, the ground layer (e.g., the second metal layer 72 and the fourth metal layer 74) has a mesh-patterned portion 72". The mesh-patterned portion 72" may transmit the ground signal or power signal. The mesh-patterned portion 52' may include a plurality of metal blocks spaced with each other and arranged in an array. For example, a density of a total area of a metal portion (i.e., the metal blocks) in a unit region of the mesh-patterned portion may be in a range from about 20% to about 60%.

FIG. 13C illustrates a top view of an example of a ground layer of the high density wiring structure 12 of the semiconductor package device 1 of FIG. 2 according to some embodiments of the present disclosure. As shown in FIG. 13C, the ground layer (e.g., the second metal layer 72 and the fourth metal layer 74) has the mesh-patterned portion 72" and the inversely dot-patterned portion 72' surrounded by the mesh-patterned portion 72". The mesh-patterned portion 72" and the inversely dot-patterned portion 72' may each transmit the ground signal or power signal. For example, a density of a total area of a metal portion (i.e., the metal blocks) in a unit region of the mesh-patterned portion may be in a range from about 20% to about 60%. For example, a ratio of the area of the solid metal portion 721 to the entire area of the inversely dot-patterned portion 72' may be in a range from about 60% to about 100%. The relatively low density of the mesh-patterned portion 72" may improve the warpage of the high density wiring structure 12.

Figure 14C:
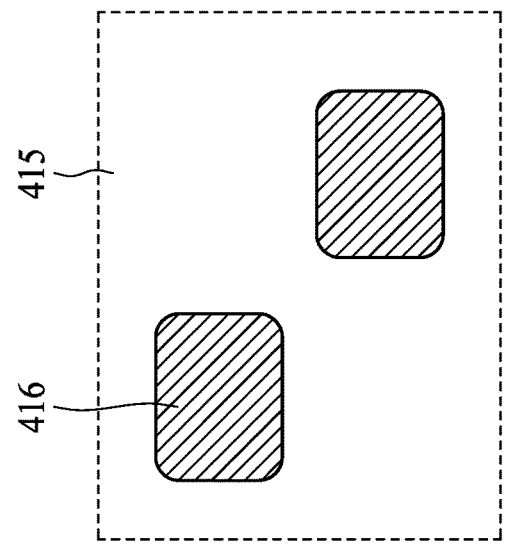
FIG. 14C illustrates a top view of an example of a transmission layer of the second middle density wiring structure of the semiconductor package device of FIG. 7 according to some embodiments of the present disclosure.
Figure 14B:
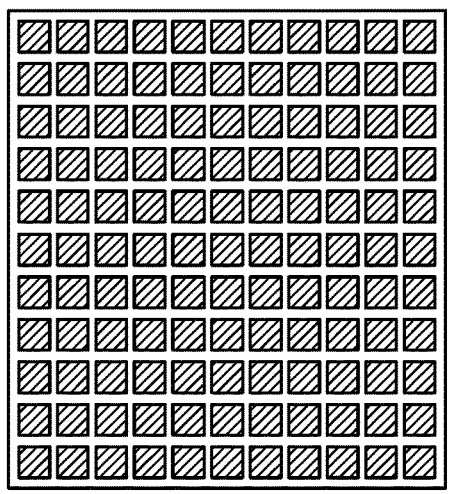
FIG. 14B illustrates a top view of an example of a ground layer of the second middle density wiring structure of the semiconductor package device of FIG. 7 according to some embodiments of the present disclosure.
Figure 14A:
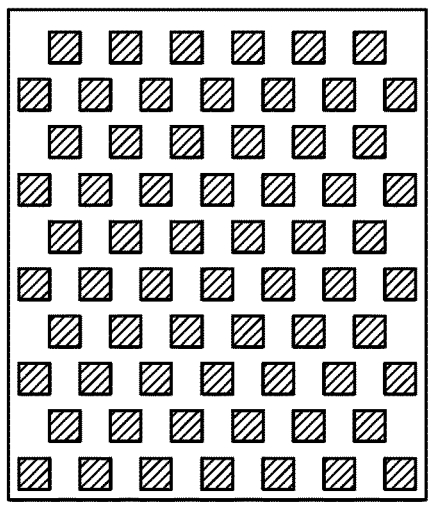
FIG. 14A illustrates a top view of an example of a ground layer of the second middle density wiring structure of the semiconductor package device of FIG. 7 according to some embodiments of the present disclosure.

FIG. 14A illustrates a top view of an example of a ground layer of the second middle density wiring structure 41 of the semiconductor package device 4 of FIG. 7 according to some embodiments of the present disclosure. As shown in FIG. 14A, the ground layer has a brick-patterned portion. For example, a density of a total area of a metal portion in a unit region of the brick-patterned portion may be in a range from about 20% to about 60%.

FIG. 14B illustrates a top view of an example of a ground layer of the second middle density wiring structure 41 of the semiconductor package device 4 of FIG. 7 according to some embodiments of the present disclosure. As shown in FIG. 14B, the ground layer has a mesh-patterned portion. For example, a density of a total area of a metal portion in a unit region of the mesh-patterned portion may be in a range from about 20% to about 60%.

FIG. 14C illustrates a top view of an example of a transmission layer of the second middle density wiring structure 41 of the semiconductor package device 4 of FIG. 7 according to some embodiments of the present disclosure. As shown in FIG. 14C, the transmission layer of the second middle density wiring structure 41 includes a blanket portion 415 and a plurality of through vias 416. The material of the blanket portion 415 may include dielectric material. The material of the through vias 416 may include one or more metal such as copper (Cu), gold (Au), aluminum (Al), titanium (Ti) or the like.

FIG. 15 through FIG. 29 illustrate a method for manufacturing a semiconductor package device according to some embodiments of the present disclosure. In some embodiments, the method is for manufacturing the substrate 1S shown in FIG. 2 and/or the semiconductor package device 1 shown in FIG. 2.

Figure 15:
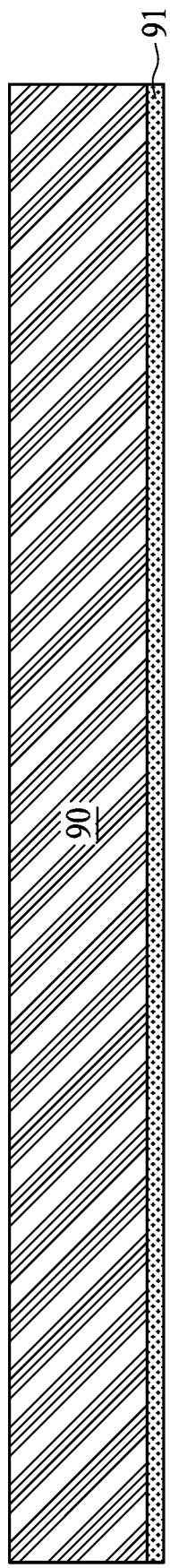
FIG. 15 illustrates one or more stages of an example of a method for manufacturing a wiring structure according to some embodiments of the present disclosure.
Figure 16:
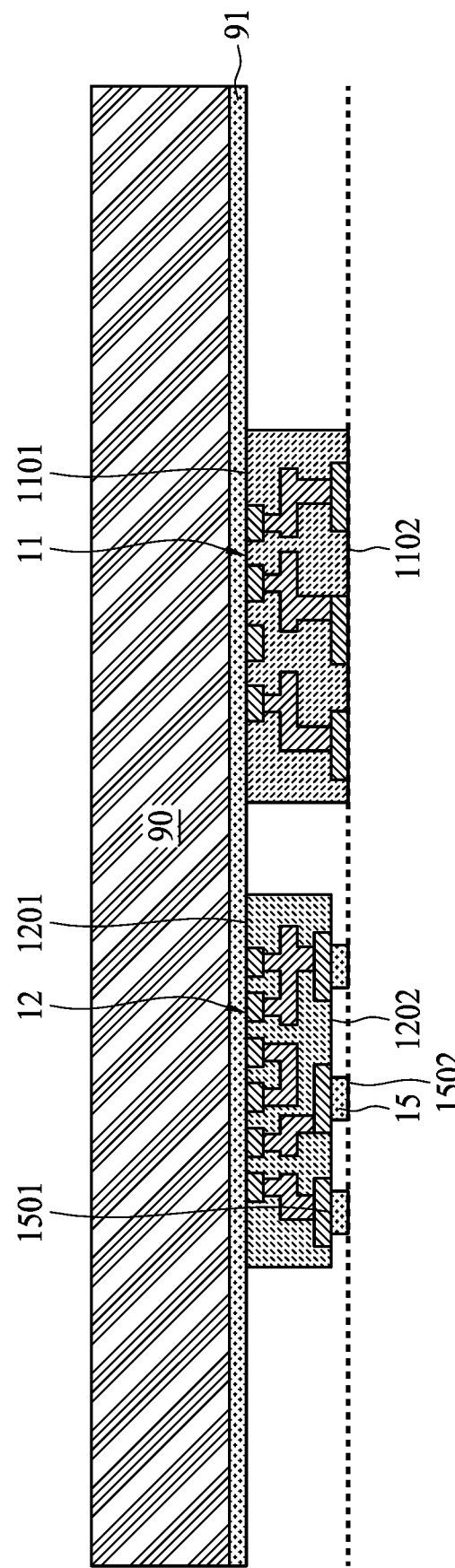
FIG. 16 illustrates one or more stages of an example of a method for manufacturing a wiring structure according to some embodiments of the present disclosure.

Referring to FIG. 15, a carrier 90 is provided with a release layer 91 formed thereto. Referring to FIG. 16, a first middle density wiring structure 11 is attached to the carrier 90 through the release layer 91. The first middle density wiring structure 11 has a first surface 1101 facing toward the carrier 90 and a second surface 1102 facing away from the carrier 90. Furthermore, a high density wiring structure 12 is attached to the carrier 90 through the release layer 91. The high density wiring structure 12 has a first surface 1201 facing toward the carrier 90 and a second surface 1202 facing away from the carrier 90. The high density wiring structure 12 and the first middle density wiring structure 11 are arranged side by side. A conductive stud 15 is formed on the second surface 1202 of the high density wiring structure 12 before the high density wiring structure 12 is attached to the carrier 90. The conductive stud 15 has a first surface 1501 facing toward the high density wiring structure 12 and a second surface 1502 facing away from the high density wiring structure 12. As a dotted reference line shown in FIG. 16, the second surface 1502 of the conductive stud 15 and the second surface 1102 of the first middle density wiring structure 11 are substantially coplanar.

Figure 17:
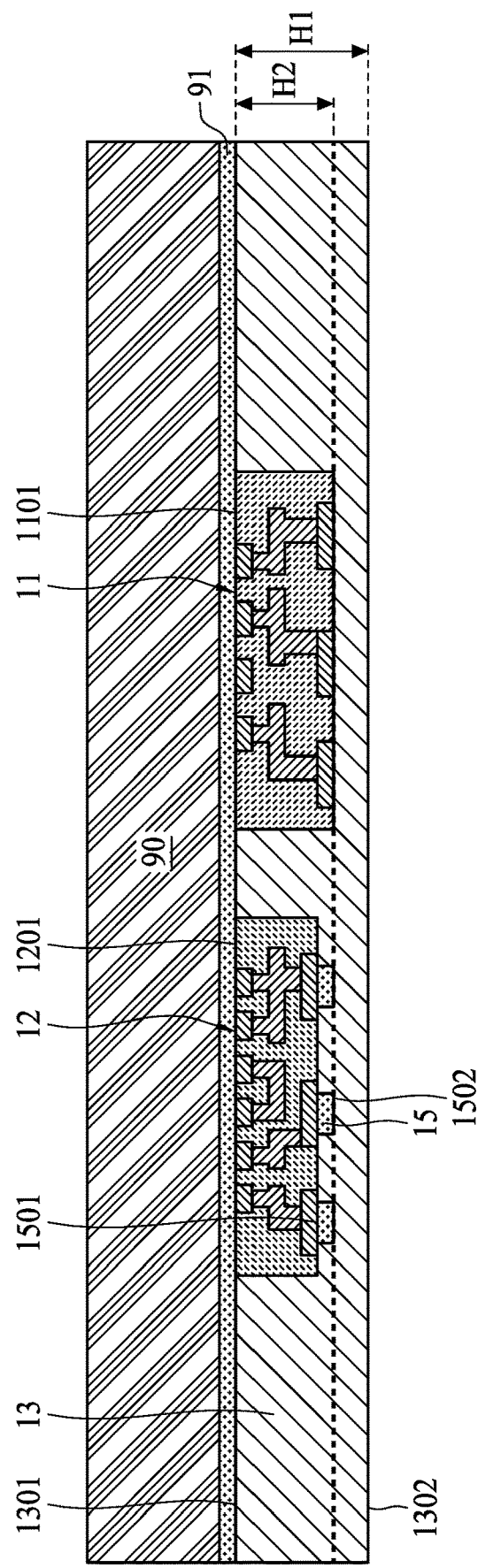
FIG. 17 illustrates one or more stages of an example of a method for manufacturing a wiring structure according to some embodiments of the present disclosure.

Referring to FIG. 17, a dielectric layer 13 is formed to the carrier 90 by, for example, a molding process followed by a grinding process. The first middle density wiring structure 11 and/or the high density wiring structure 12 are embedded within the dielectric layer 13. The dielectric layer 13 has a first surface 1301 facing toward the carrier 90 and a second surface 1302 facing away from the carrier 90. The dielectric layer 13 has a first height H1 and the first middle density wiring structure 11 has a second height H2 different from the first height H1. In some embodiments, the first height H1 is greater than the second height H2.

Figure 18:
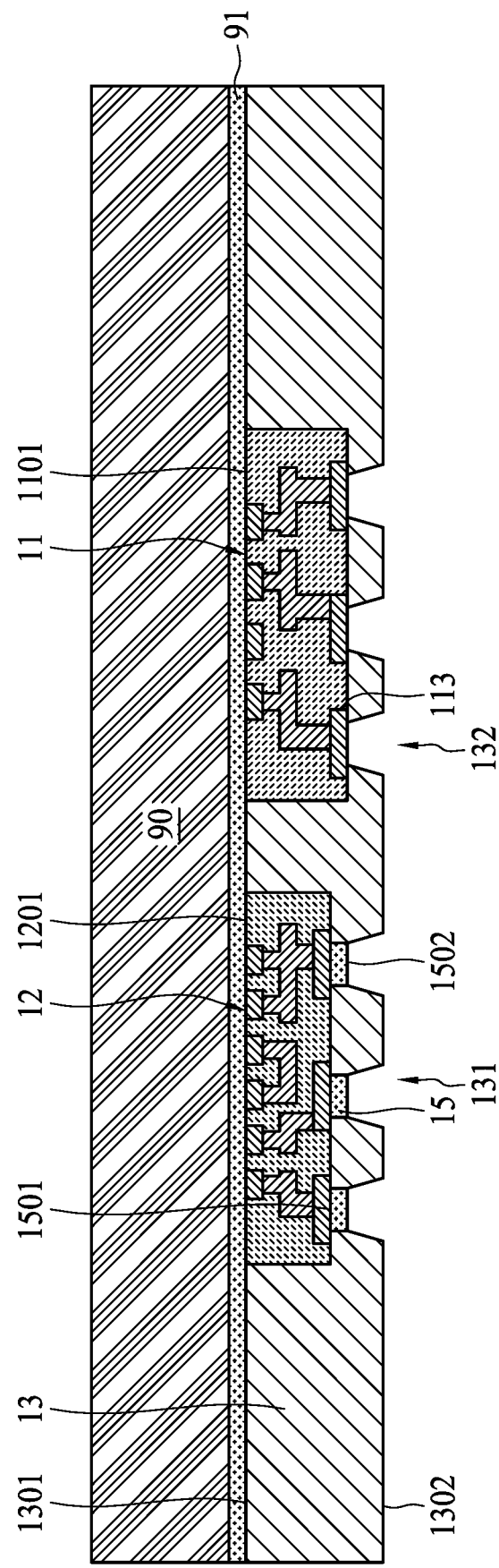
FIG. 18 illustrates one or more stages of an example of a method for manufacturing a wiring structure according to some embodiments of the present disclosure.

Referring to FIG. 18, the dielectric layer 13 is patterned to form a first opening 131. The first opening 131 is substantially aligned with the conductive stud 15 and exposes the conductive stud 15. Furthermore, the dielectric layer 13 is patterned to form a second opening 132. The second opening 132 is substantially aligned with a second circuit layer 113 of the first middle density wiring structure 11 and exposes the second circuit layer 113.

Figure 19:
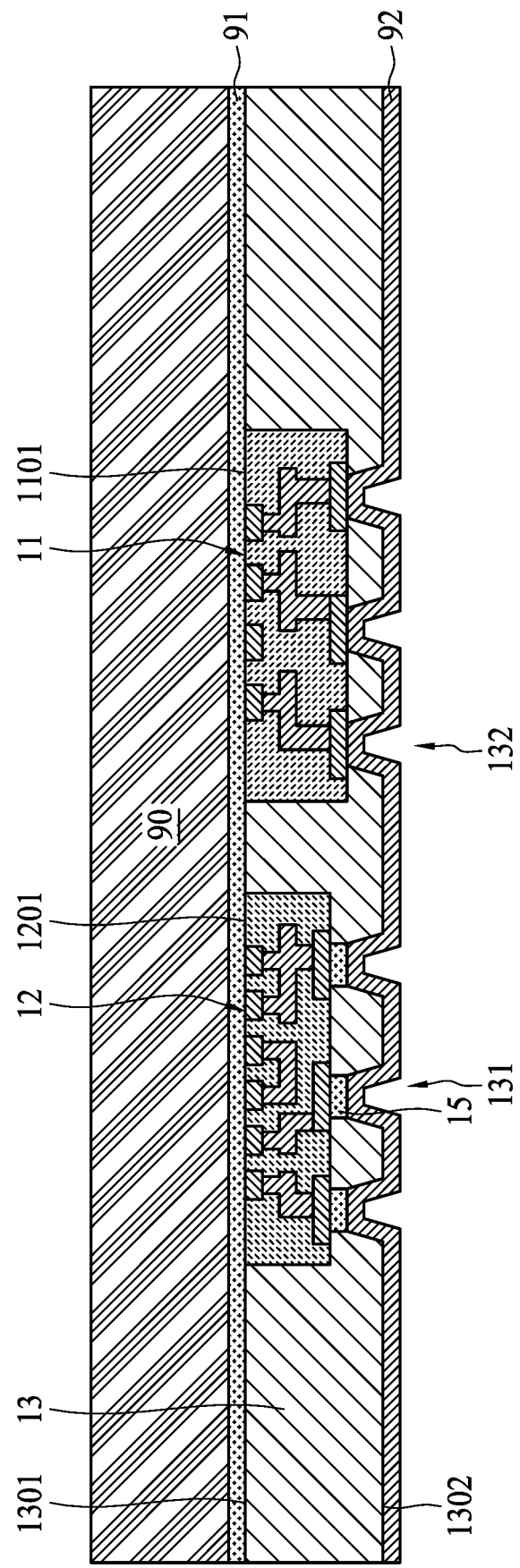
FIG. 19 illustrates one or more stages of an example of a method for manufacturing a wiring structure according to some embodiments of the present disclosure.

Referring to FIG. 19, a conductive layer 92 is formed on the second surface 1302 of the dielectric layer 13 and within the first opening 131 and the second opening 132.

Figure 20:
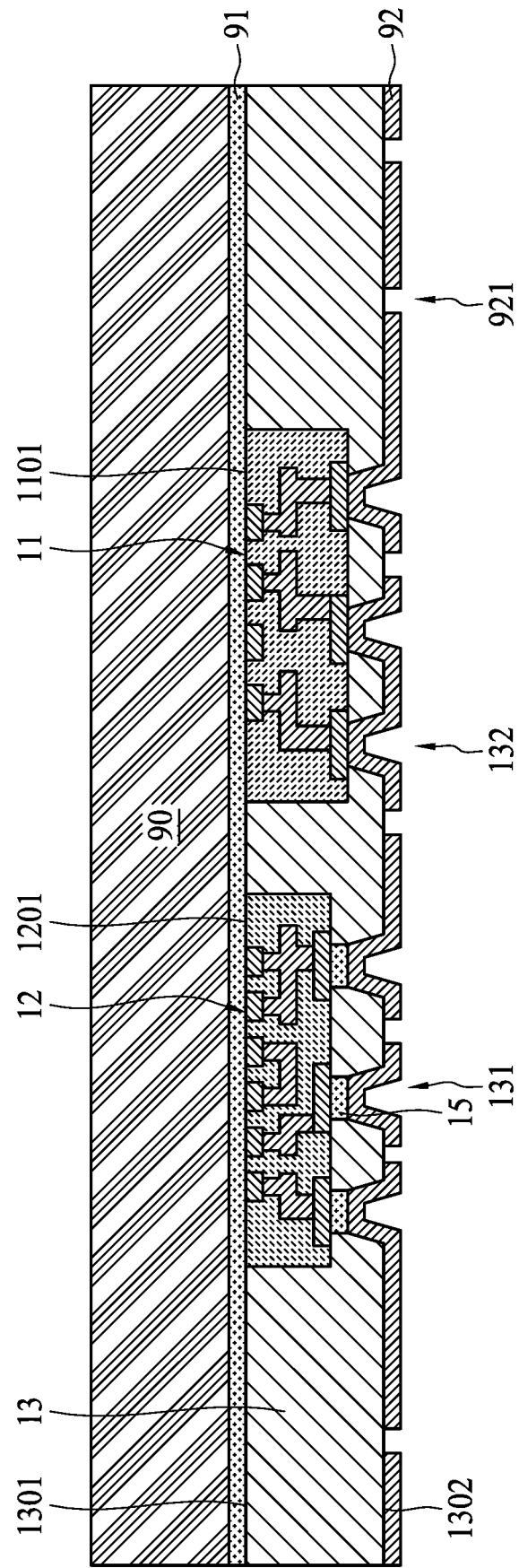
FIG. 20 illustrates one or more stages of an example of a method for manufacturing a wiring structure according to some embodiments of the present disclosure.

Referring to FIG. 20, the conductive layer 92 is patterned to form an opening 921. The patterned conductive layer 92 is indicated as a first circuit layer 102 as shown in FIG. 21.

Figure 21:
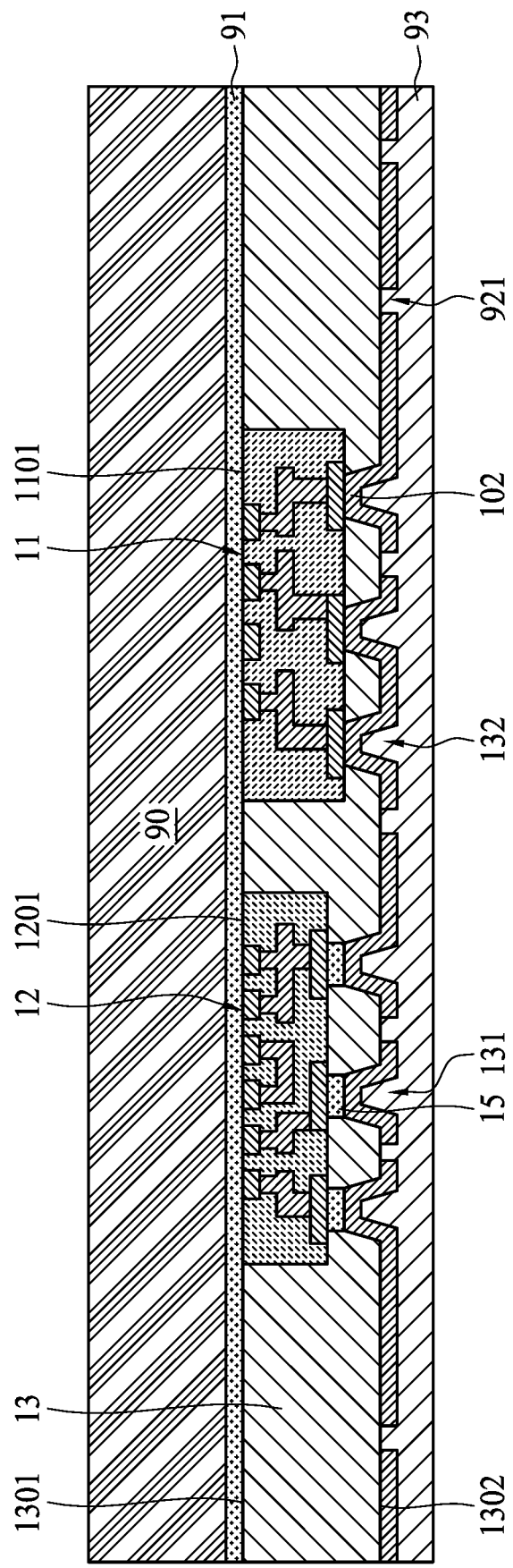
FIG. 21 illustrates one or more stages of an example of a method for manufacturing a wiring structure according to some embodiments of the present disclosure.

Referring to FIG. 21, an insulation material 93 is formed to cover the first circuit layer 102.

Figure 22:
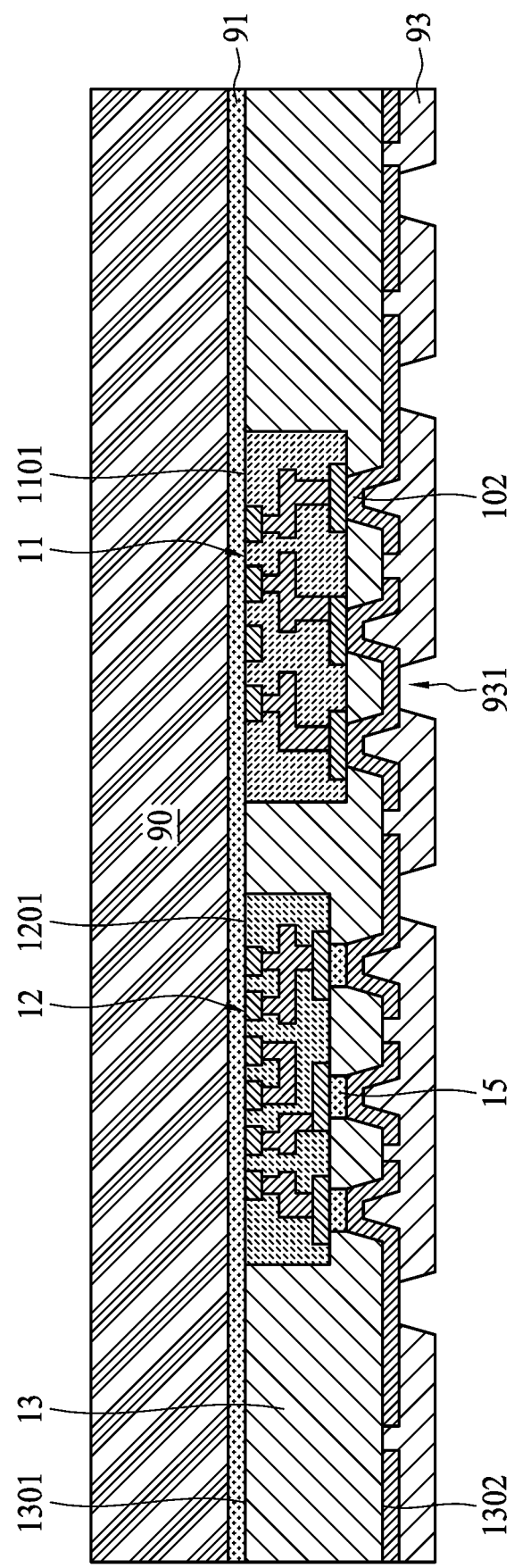
FIG. 22 illustrates one or more stages of an example of a method for manufacturing a wiring structure according to some embodiments of the present disclosure.

Referring to FIG. 22, the insulation material 93 is patterned to form an opening 931 at the planar region of the insulation material 93. The patterned insulation material 93 is indicated as an insulation layer 101 as shown in FIG. 23.

Figure 23:
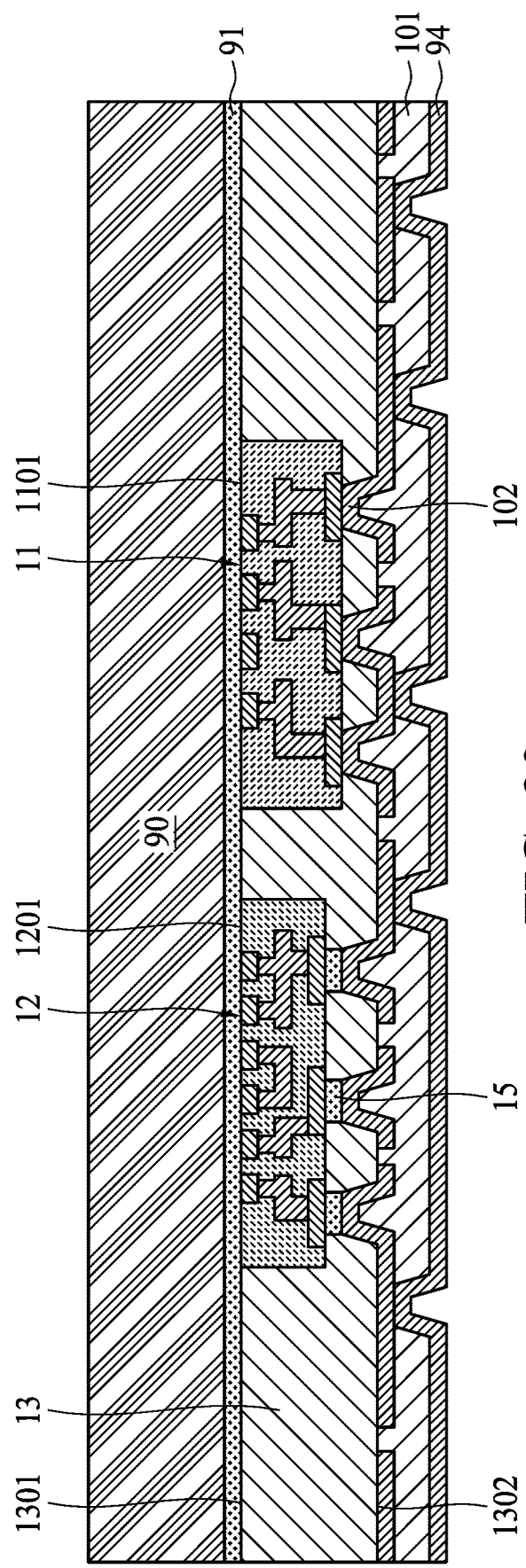
FIG. 23 illustrates one or more stages of an example of a method for manufacturing a wiring structure according to some embodiments of the present disclosure.

Referring to FIG. 23, a conductive layer 94 is formed on the insulation layer 101. In some embodiments, a portion of the conductive layer 94 may be in contact with the first circuit layer 102.

Figure 24:
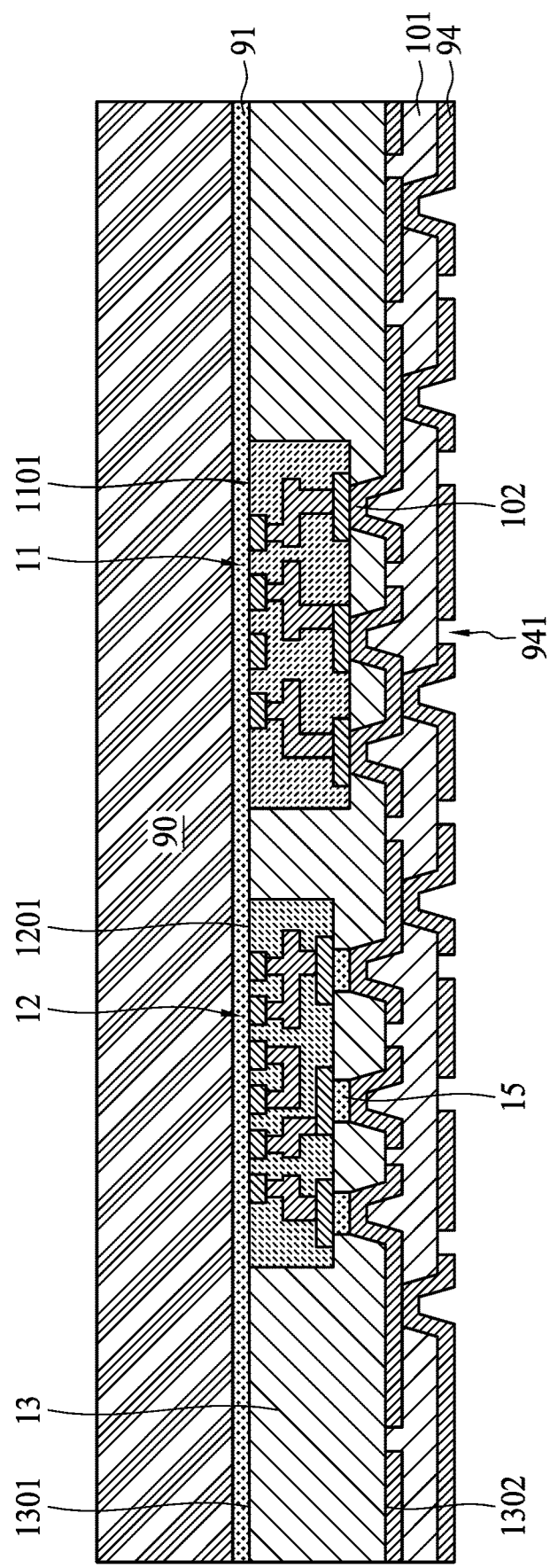
FIG. 24 illustrates one or more stages of an example of a method for manufacturing a wiring structure according to some embodiments of the present disclosure.

Referring to FIG. 24, the conductive layer 94 is patterned to form an opening 941 at the planar region of the conductive material 84. The patterned conductive layer 94 is indicated as a second circuit layer 103 as shown in FIG. 25.

Figure 25:
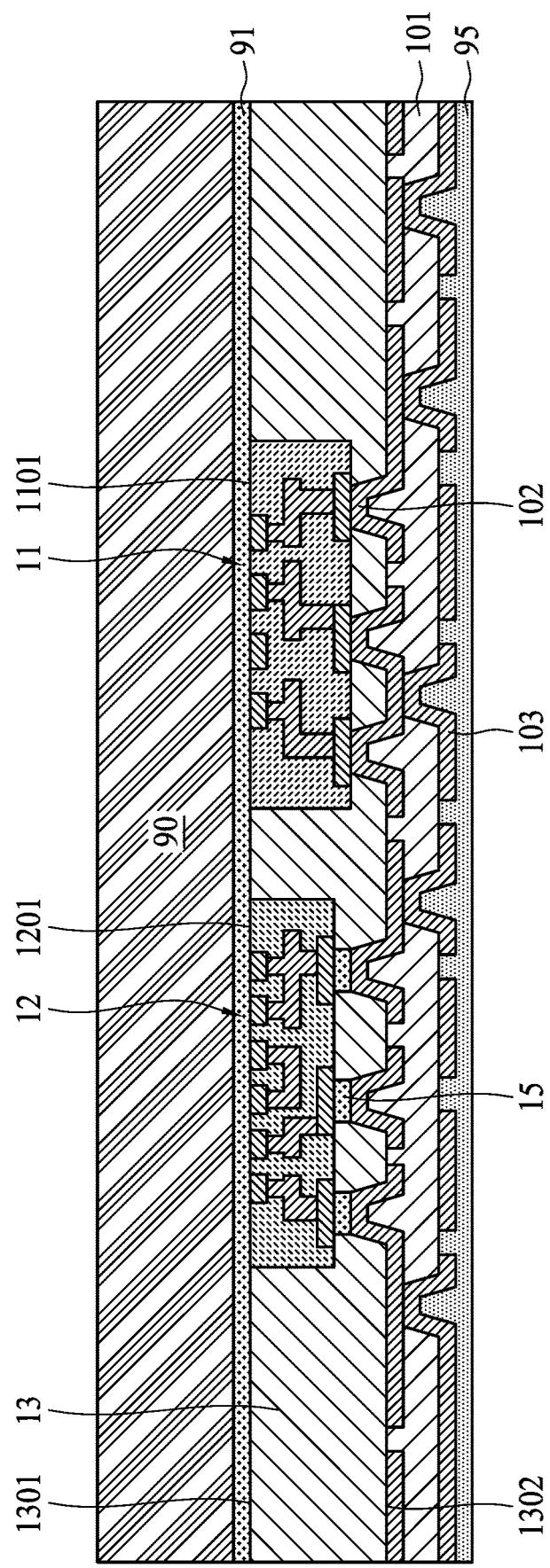
FIG. 25 illustrates one or more stages of an example of a method for manufacturing a wiring structure according to some embodiments of the present disclosure.

Referring to FIG. 25, a protection material 95 is formed to cover the second circuit layer 103.

Figure 26:
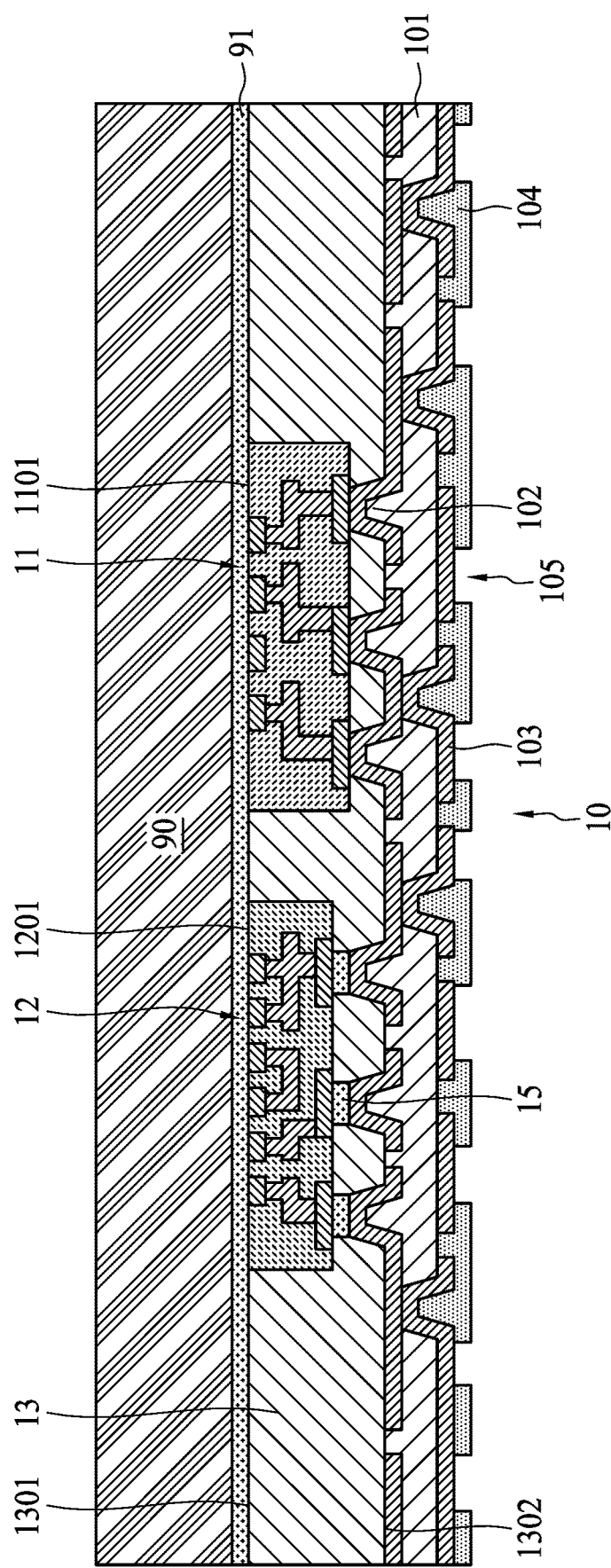
FIG. 26 illustrates one or more stages of an example of a method for manufacturing a wiring structure according to some embodiments of the present disclosure.

Referring to FIG. 26, the protection material 95 is patterned to form a plurality of openings 105. The openings 105 expose portions of the second circuit layer 103. The patterned protection material 95 is indicated as a protection layer 104 as shown in FIG. 26. Referring to FIG. 26, the insulation layer 101, the first circuit layer 102, the second circuit layer 103, and the protection layer 104 are collectively indicated as the low density wiring structure 10 as illustrated in the FIG. 2. The low density wiring structure 10 is formed to the first middle density wiring structure 11 and the high density wiring structure 12. In some embodiments, a line space of a circuit layer of the low density wiring structure 10 is greater than a line space of a circuit layer of the first middle density wiring structure 11, and the line space of the circuit layer of the first middle density wiring structure 11 is greater than a line space of a circuit layer of the high density wiring structure 12.

Figure 27:
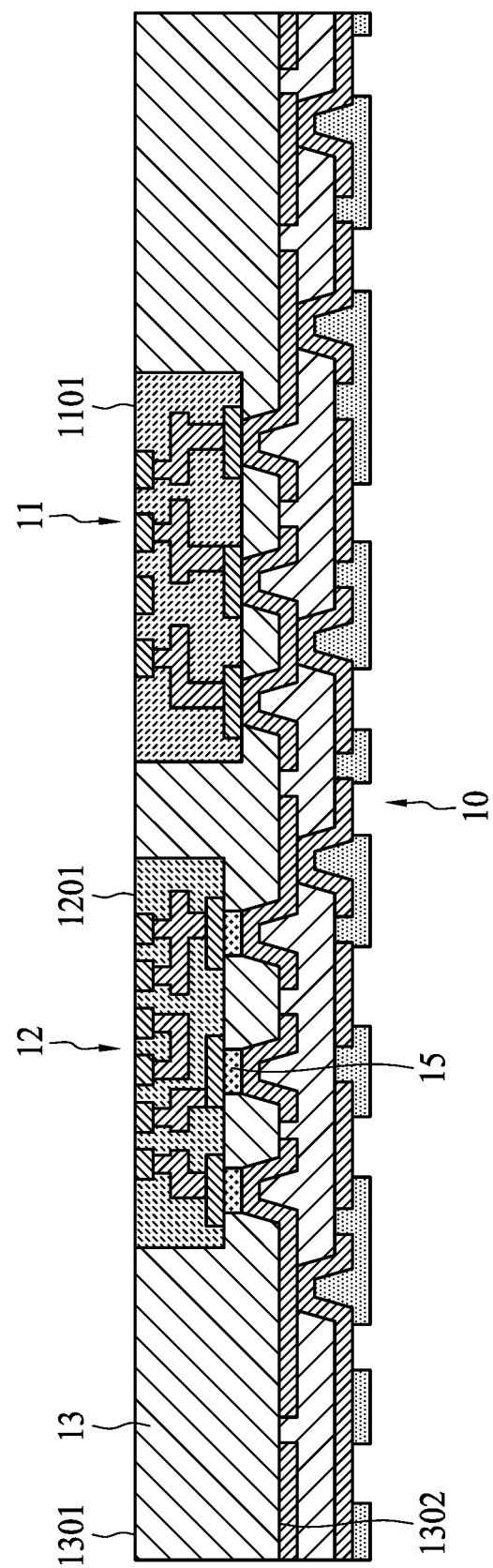
FIG. 27 illustrates one or more stages of an example of a method for manufacturing a wiring structure according to some embodiments of the present disclosure.

As shown in FIG. 27, the carrier 90 and the release layer 91 are removed. The first surface 1101 of the first middle density wiring structure 11, the first surface 1201 of the high density wiring structure 12 and the first surface 1301 of the dielectric layer 13 are exposed and substantially coplanar.

Figure 28:
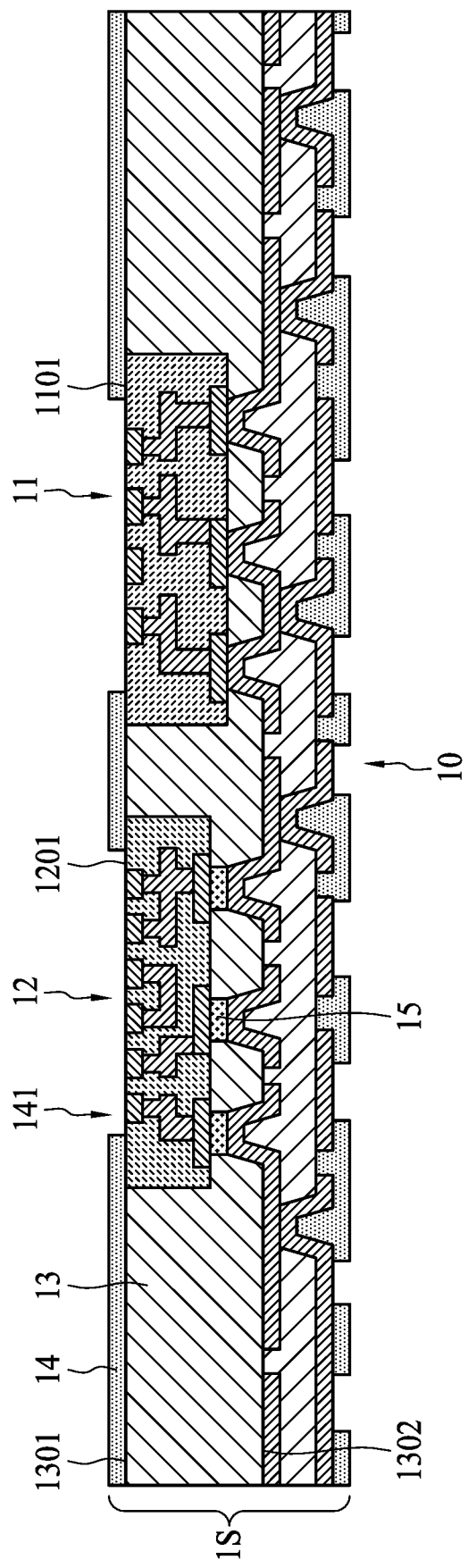
FIG. 28 illustrates one or more stages of an example of a method for manufacturing a wiring structure according to some embodiments of the present disclosure.

Referring to FIG. 28, a protection layer 14 is formed to the first middle density wiring structure 11, the high middle density wiring structure 12 and the dielectric layer 13 and is patterned to form a plurality of opening 141 to expose the first surface 1101 of the first middle density wiring structure 11 and/or the first surface 1201 of the high density wiring structure 12. As shown in FIG. 28, the low density wiring structure 10, the first middle density wiring structure 11, the high density wiring structure 12, the dielectric layer 13, the protection layer 14 and the conductive stud 15 are collectively indicated as the substrate 1S as illustrated in the FIG. 2.

Figure 29:
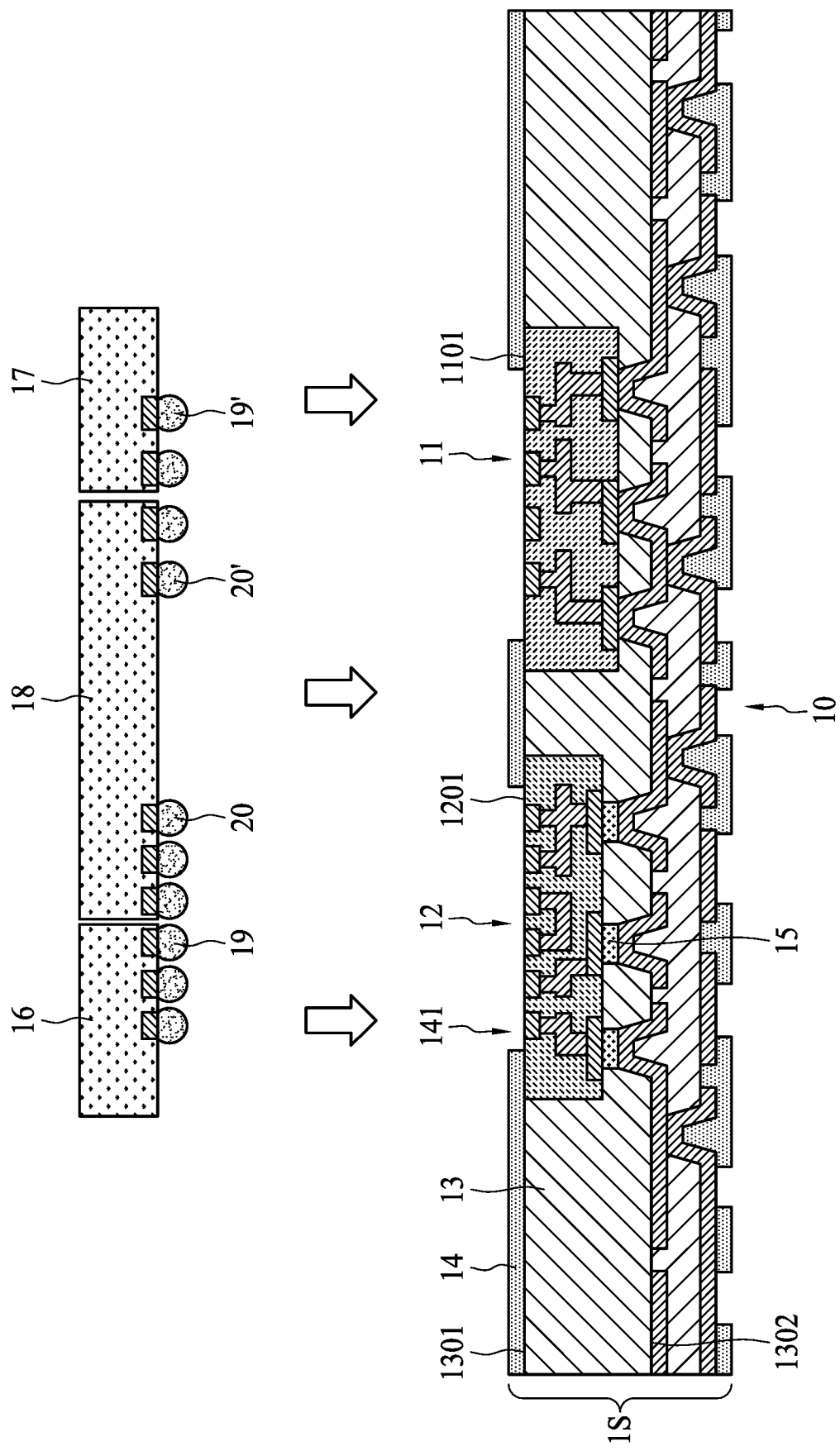
FIG. 29 illustrates one or more stages of an example of a method for manufacturing wiring structure according to some embodiments of the present disclosure.

Referring to FIG. 29, a first die 16 is attached to the substrate 1S through a plurality of first connection elements 19. A second die 17 may be attached to the substrate 1S through a plurality of second connection elements 19'. A third die 18 may be attached to the substrate 1S near the first die 16 through a plurality of third connection elements 20 and/or a plurality of third connection elements 20'. In some embodiments, the first die 16, the second die 17 and the third die 18 can be attached in sequence or in a single step. Since the first surface 1101 of the first middle density wiring structure 11, the first surface 1201 of the high density wiring structure 12 and the first surface 1301 of the dielectric layer 13 are substantially coplanar, the yield of die attaching process can be improved. In some embodiments, less than three dies or more than three dies may be attached to the substrate 1S. A singulation process may be performed after the steps of FIG. 29 to form the semiconductor package device 1 shown in FIG. 2.

Figure 30:
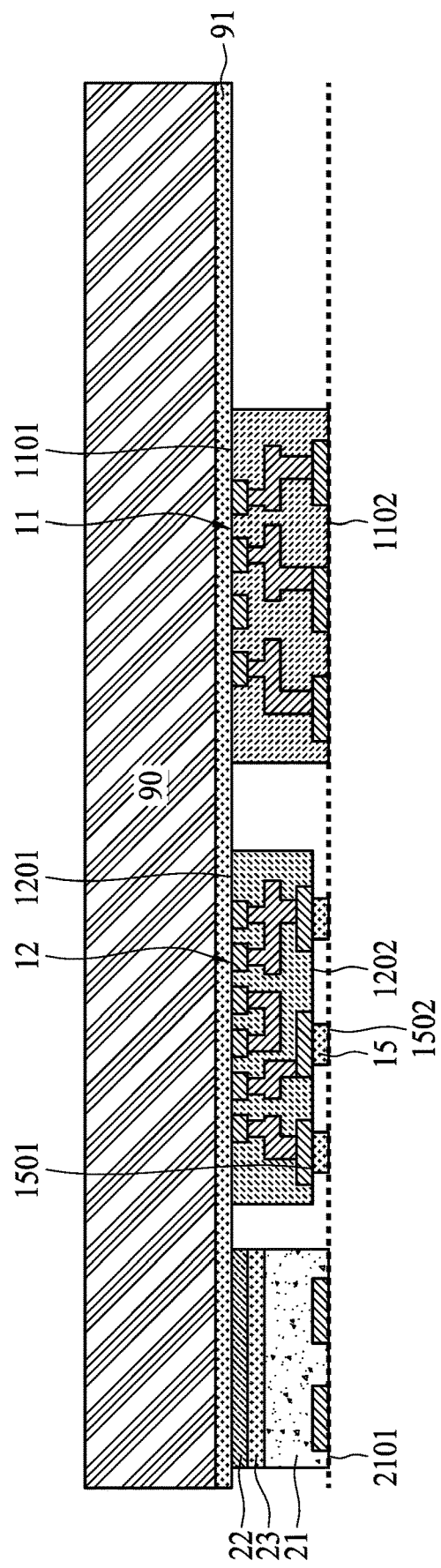
FIG. 30 illustrates one or more stages of an example of a method for manufacturing a wiring structure according to some embodiments of the present disclosure.

FIG. 30 illustrates one or more stages of an example of a method for manufacturing a semiconductor package device according to some embodiments of the present disclosure. In some embodiments, the method is for manufacturing the substrate 2S shown in FIG. 3 and/or the semiconductor package device 2 shown in FIG. 3. The initial stages of the illustrated process are the same as, or similar to, the stages illustrated in FIG. 15 to FIG. 16. FIG. 30 depicts a stage subsequent to that depicted in FIG. 16.

Referring to FIG. 30, a device 21 is attached to the carrier 90 with a spacer 22 and an adhesive layer 23. In some embodiments, the device 21 may be attached before the stage of FIG. 16. The device 21 has a surface 2101 facing away from the carrier 90. The surface 2101 of the device 21, the second surface 1102 of the first middle density wiring structure 11 and the second surface 1202 of the high density wiring structure 12 are substantially coplanar. Afterwards, one or more stages in FIG. 17 through FIG. 29 and a singulation process may be performed to form the semiconductor package device 2 with the substrate 2S shown in FIG. 3.

Figure 31:
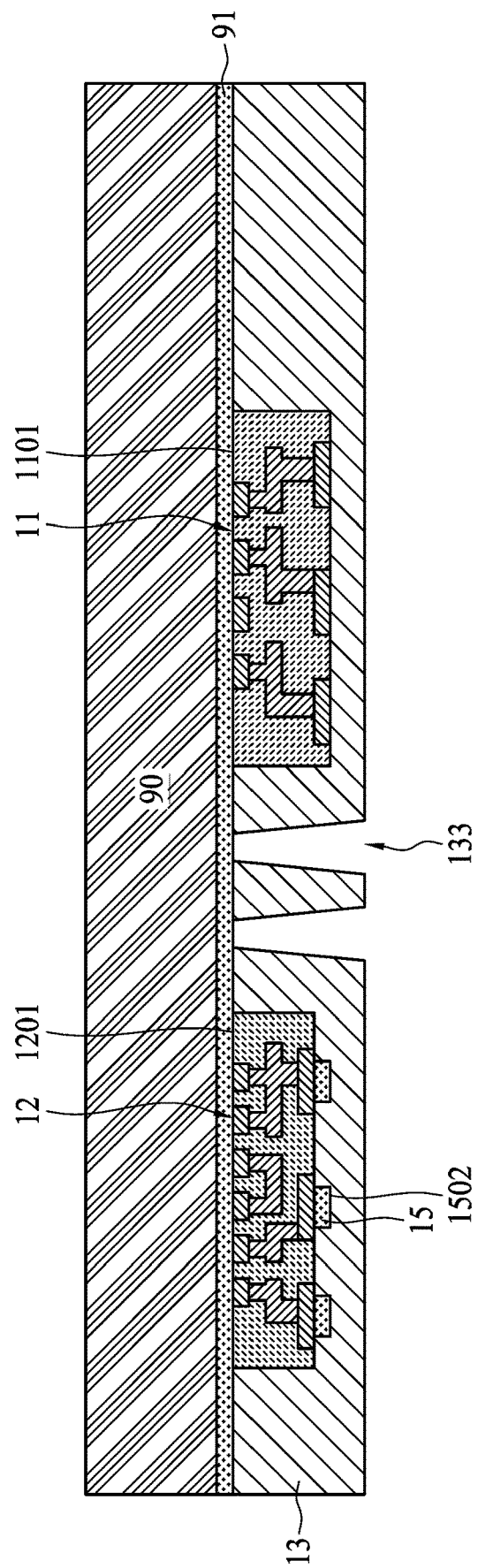
FIG. 31 illustrates one or more stages of an example of a method for manufacturing a wiring structure according to some embodiments of the present disclosure.
Figure 32:
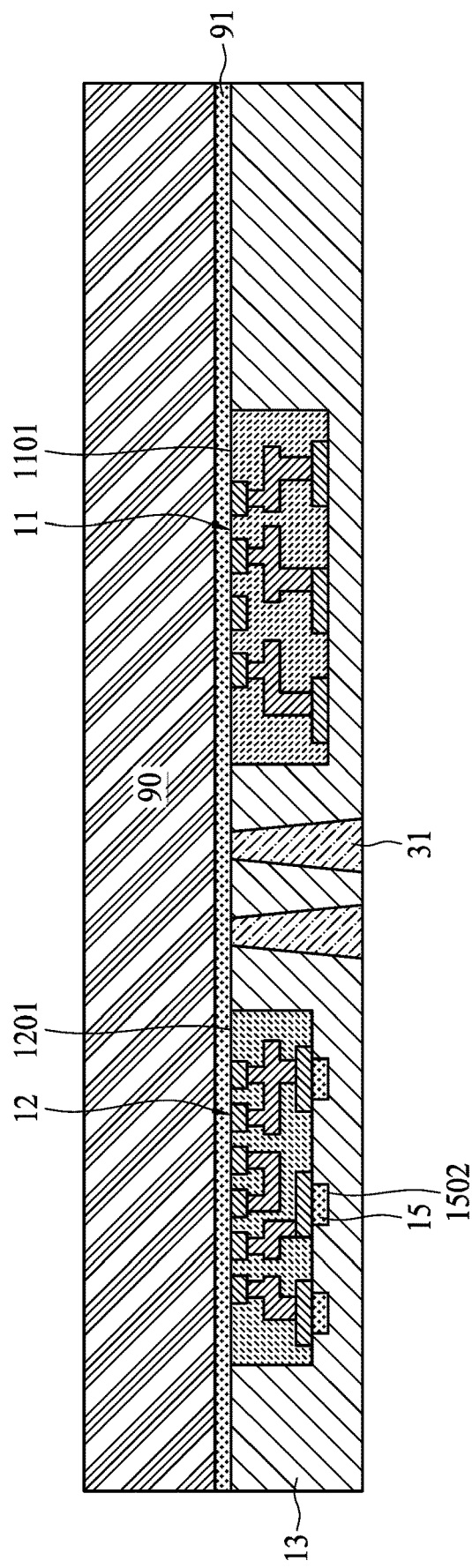
FIG. 32 illustrates one or more stages of an example of a method for manufacturing a wiring structure according to some embodiments of the present disclosure.

FIG. 31 and FIG. 32 illustrate one or more stages of an example of a method for manufacturing a semiconductor package device according to some embodiments of the present disclosure. In some embodiments, the method is for manufacturing the substrate 3S shown in FIG. 5 and/or the semiconductor package device 3 shown in FIG. 5. The initial stages of the illustrated process are the same as, or similar to, the stages illustrated in FIG. 15 to FIG. 17. FIG. 31 depicts a stage subsequent to that depicted in FIG. 17.

Referring to FIG. 31, the dielectric layer 13 is patterned to form a plurality of openings 133 after a stage similar to that of FIG. 17, where the difference is that a distance between the first middle density wiring structure 11 and the high density wiring structure 12 is greater than that in FIG. 17. The plurality of openings 33 extends through the dielectric layer 13 and is disposed between the first middle density wiring structure 11 and the high density wiring structure 12.

Referring to FIG. 32, a plurality of through-via 31 is formed in the plurality of openings 33 by, for example, electroplating process followed by a polishing process. Afterwards, one or more stages in FIG. 18 through FIG. 29 and a singulation process may be performed to form the semiconductor package device 3 with the substrate 3S shown in FIG. 5.

Figure 33:
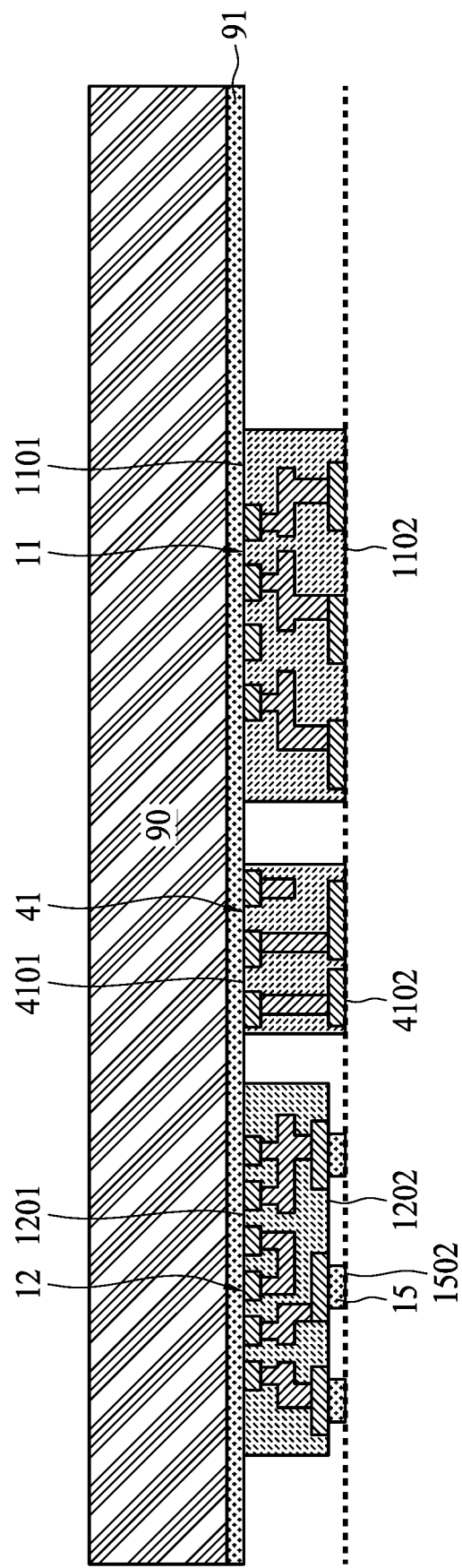
FIG. 33 illustrates one or more stages of an example of a method for manufacturing a wiring structure according to some embodiments of the present disclosure.

FIG. 33 illustrates one or more stages of an example of a method for manufacturing a semiconductor package device according to some embodiments of the present disclosure. In some embodiments, the method is for manufacturing the substrate 4S shown in FIG. 7 and/or the semiconductor package device 4 shown in FIG. 7. The initial stage of the illustrated process is the same as, or similar to, the stage illustrated in FIG. 15. FIG. 33 depicts a stage subsequent to that depicted in FIG. 15.

Referring to FIG. 33, the first middle density wiring structure 11, the high density wiring structure 12 and a second middle density wiring structure 41 are attached to the carrier 90 through the release layer 91 in sequence or in a single step. The second middle density wiring structure 41 has a first surface 4101 facing toward the carrier 90 and a second surface 1402 facing away from the carrier 90. In some embodiments, the second surface 1402 of the second middle density wiring structure 41 and the second surface 1102 of the first middle density wiring structure 11 are substantially at the same elevation. Afterwards, one or more stages in FIG. 17 through FIG. 29 and a singulation process may be performed to form the semiconductor package device 4 with the substrate 4S shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate comprising:
   a low density wiring structure;
   a first middle density wiring structure electrically connected to the low density wiring structure; and
   a high density wiring structure electrically connected to the low density wiring structure, wherein the high density wiring structure and the first middle density wiring structure are disposed side by side,
   wherein a line space of a circuit layer of the low density wiring structure is greater than a line space of a circuit layer of the first middle density wiring structure, and the line space of the circuit layer of the first middle density wiring structure is greater than a line space of a circuit layer of the high density wiring structure,
   wherein at least one of the first middle density wiring structure or the high density wiring structure has a fan-out structure.

2. The substrate of claim 1, wherein the first middle density wiring structure has a first surface facing away from the low density wiring structure, the high density wiring structure has a first surface facing away from the low density wiring structure, and the first surface of the first middle density wiring structure and the first surface of the high density wiring structure are substantially coplanar.

3. The substrate of claim 2, further comprising a dielectric layer disposed on the low density wiring structure, wherein the dielectric layer encapsulates the first middle density wiring structure and the high density wiring structure, and wherein the dielectric layer has a first surface away from the low density wiring structure, the first middle density wiring structure has a first surface facing away from the low density wiring structure, and the first surface of the first middle density wiring structure and the first surface of the dielectric layer are substantially coplanar.

4. The substrate of claim 1, further comprising a dielectric layer contacting the first middle density wiring structure and the high density wiring structure.

5. The substrate of claim 4, wherein the dielectric layer contacts a lateral surface and a second surface of the first middle density wiring structure facing toward the low density wiring structure, and a lateral surface and a second surface of the high density wiring structure facing toward the low density wiring structure.

6. The substrate of claim 1, further comprising a second middle density wiring structure disposed between the first middle density wiring structure and the high density wiring structure.

7. The substrate of claim 1, wherein the at least one of the first middle density wiring structure or the high density wiring structure has a bottom surface and an upper surface opposite to the bottom surface, the bottom surface faces the low density wiring structure and includes a circuit region electrically connected to the low density wiring structure, the upper surface includes a bonding region bonded to an external circuit, and a density of conductive pads of the circuit region of the bottom surface is greater than a density of conductive pads of the bonding region of the upper surface.

8. The substrate of claim 1, wherein the first middle density wiring structure includes a first plurality of conductive layers and a second plurality of conductive layers spaced apart from the first plurality of conductive layers, wherein a line space of the first plurality of conductive layers is smaller than that of the second plurality of conductive layers.

9. The substrate of claim 1, wherein the high density wiring structure comprises a first metal layer and a second metal layer disposed below the first metal layer, and wherein the first metal layer is configured to transmit one or more data signals and the second metal layer is configured to transmit one or more power signals.

10. The substrate of claim 1, further comprising a plurality of through-vias disposed side by side with the at least one of the first middle density wiring structure or the high density wiring structure.

11. The substrate of claim 10, wherein a width of the plurality of through-vias gradually increases along a direction toward the low density wiring structure.

12. The substrate of claim 11, wherein a length of the plurality of through-vias is greater than a thickness of the at least one of the first middle density wiring structure or the high density wiring structure.

13. A semiconductor package device, comprising:
a substrate, comprising:
a low density wiring structure;
a first middle density wiring structure electrically connected to the low density wiring structure; and
a high density wiring structure electrically connected to the low density wiring structure, wherein the high density wiring structure and the first middle density wiring structure are disposed side by side,
wherein a line space of a circuit layer of the low density wiring structure is greater than a line space of a circuit layer of the first middle density wiring structure, and the line space of the circuit layer of the first middle density wiring structure is greater than a line space of a circuit layer of the high density wiring structure; and
a first die disposed on the high density wiring structure of the substrate and electrically connected with the high density wiring structure, and
a second die disposed on the high density wiring structure of the substrate and side by side with the first die, and electrically connected with the high density wiring structure.

14. The semiconductor package device of claim 13, further comprising a third die disposed on the first middle density wiring structure of the substrate and side by side with the first die, wherein the first die is further disposed on the first middle density wiring structure of the substrate and electrically connected to the third die through the first middle density wiring structure.

15. The semiconductor package device of claim 13, wherein the first die has a first projecting area on a first surface of the low density wiring structure in a first direction and the high density wiring structure has a second projecting area on the first surface of the lower wiring structure in the first direction, and wherein the first projecting area is overlapped with the second projecting area.

16. The semiconductor package device of claim 13, wherein the first die is configured to transmit one or more signals with the second die through the high density wiring structure.

17. The semiconductor package device of claim 13, wherein at least one of the first middle density wiring structure or the high density wiring structure has a fan-out structure.

18. The semiconductor package device of claim 17, wherein the at least one of the first middle density wiring structure or the high density wiring structure have a bottom surface and an upper surface opposite to the bottom surface, the bottom surface faces the low density wiring structure and includes a circuit region electrically connected to the low density wiring structure, the upper surface includes a bonding region bonded to an external circuit, and a density of conductive pads of the circuit region of the bottom surface is greater than a density of conductive pads of the bonding region of the upper surface.

19. The semiconductor package device of claim 13, further comprising a plurality of through-vias disposed side by side with the at least one of the first middle density wiring structure or the high density wiring structure.

20. The semiconductor package device of claim 19, wherein a width of the through-vias gradually increases along a direction toward the low density wiring structure.

\* \* \* \* \*